US009172524B2

(12) United States Patent
Yoon et al.

(10) Patent No.: US 9,172,524 B2
(45) Date of Patent: Oct. 27, 2015

(54) METHOD OF GENERATING UNAMBIGUOUS CORRELATION FUNCTION FOR TMBOC (6,1,4/33)SIGNAL BASED ON PARTIAL CORRELATION FUNCTIONS, APPARATUS FOR TRACKING TMBOC SIGNAL, AND SATELLITE NAVIGATION SIGNAL RECEIVER SYSTEM USING THE SAME

(71) Applicant: Research & Business Foundation SUNGKYUNKWAN UNIVERSITY, Suwon-si (KR)

(72) Inventors: Seok Ho Yoon, Suwon-si (KR); Keun Hong Chae, Suwon-si (KR)

(73) Assignee: Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/534,732

(22) Filed: Nov. 6, 2014

(65) Prior Publication Data

US 2015/0124919 A1    May 7, 2015

(30) Foreign Application Priority Data

Nov. 7, 2013    (KR) .................. 10-2013-0135012

(51) Int. Cl.
*H04L 27/00*    (2006.01)
*H03D 3/24*    (2006.01)
*H04L 7/00*    (2006.01)
*H03L 7/06*    (2006.01)
*H04B 1/16*    (2006.01)

(52) U.S. Cl.
CPC ................ *H04L 7/0033* (2013.01); *H03L 7/06* (2013.01); *H04B 1/16* (2013.01)

(58) Field of Classification Search
USPC ......... 375/211, 142, 148, 149, 150, 215, 219, 375/220, 226, 227, 228, 240.26–240.29, 375/240.11, 285, 284, 270, 295, 316, 346, 375/347, 350, 349, 33, 2, 338, 339, 327, 375/326, 324, 325, 354, 376, 375, 373, 371
See application file for complete search history.

(56) References Cited

U.S. PATENT DOCUMENTS

| 7,555,033 | B2 * | 6/2009 | Lillo et al. | ..................... 375/150 |
| 7,916,771 | B2 * | 3/2011 | Julien | ..................... G01S 19/30 |
| | | | | 342/357.22 |
| 2005/0281325 | A1 * | 12/2005 | Lillo et al. | ..................... 375/150 |
| 2007/0153882 | A1 * | 7/2007 | Eerola | ..................... G01S 19/30 |
| | | | | 375/150 |

(Continued)

*Primary Examiner* — Linda Wong
(74) *Attorney, Agent, or Firm* — NSIP Law

(57) ABSTRACT

A method of generating an unambiguous correlation function for a TMBOC(6,1,4/33) signal, an apparatus for tracking a TMBOC signal, and a satellite navigation signal receiver system using the same are disclosed herein. The method of generating a correlation function for a TMBOC(6,1,4/33) signal includes generating a delayed signal delayed based on a phase delay with respect to the signal pulse train of a TMBOC(6,1,4/33)-modulated received signal; generating BOC(1,1) partial correlation functions and BOC(6,1) partial correlation functions by performing an auto-correlation operation on the received signal and the delayed signal with respect to the total time; generating a BOC(1,1) sub-correlation function; obtaining a first intermediate correlation function, obtaining second to eleventh intermediate correlation functions, and generating the BOC(6,1) sub-correlation function by summing all the first to eleventh intermediate correlation functions; and generating a main correlation function by combining the BOC(1,1) and BOC(6,1) sub-correlation functions.

10 Claims, 7 Drawing Sheets

(56) References Cited

U.S. PATENT DOCUMENTS

| | | | |
|---|---|---|---|
| 2007/0258511 A1* | 11/2007 | Knight et al. | 375/149 |
| 2009/0046766 A1* | 2/2009 | Avellone | G01S 19/30 375/142 |
| 2009/0279592 A1* | 11/2009 | Pratt et al. | 375/148 |
| 2010/0061427 A1* | 3/2010 | Lopez-Risueno et al. | 375/150 |
| 2010/0104046 A1* | 4/2010 | Hodgart | G01S 19/30 375/340 |
| 2011/0254732 A1* | 10/2011 | Martin | G01S 19/30 342/357.59 |
| 2011/0261805 A1* | 10/2011 | Landry et al. | 370/342 |
| 2012/0063491 A1* | 3/2012 | Kong | H04B 1/7113 375/148 |
| 2014/0119361 A1* | 5/2014 | Keegan et al. | 370/345 |
| 2014/0125522 A1* | 5/2014 | Lee | G01S 19/01 342/357.68 |
| 2014/0191903 A1* | 7/2014 | Vigneau | G01S 19/44 342/357.68 |

\* cited by examiner $$A \ominus B = |A| + |B| - |A-B|$$

METHOD OF GENERATING UNAMBIGUOUS CORRELATION FUNCTION FOR TMBOC (6,1,4/33)SIGNAL BASED ON PARTIAL CORRELATION FUNCTIONS, APPARATUS FOR TRACKING TMBOC SIGNAL, AND SATELLITE NAVIGATION SIGNAL RECEIVER SYSTEM USING THE SAME

BACKGROUND

1. Technical Field

The present invention relates generally to satellite navigation technology and, more particularly, to a scheme for tracking a binary offset carrier (BOC) signal that is used for satellite navigation technology.

2. Description of the Related Art

Satellite navigation technology is technology that is configured such that when a plurality of navigation satellites randomly transmit a plurality of satellite navigation signals, each containing information about the current location and time of the corresponding navigation satellite, to the ground, a satellite navigation receiver on the ground receives the plurality of satellite navigation signals, calculates the coordinates of the current locations of the navigation satellites and the arrival times of the signals, and determines its three-dimensional (3D) location in the Earth coordinate system using triangulation.

A satellite navigation receiver theoretically requires at least three satellite signals in order to determine its longitude, latitude and height, and requires one more satellite signal in order to improve accuracy by eliminating time error between satellites. Accordingly, at least four satellites are required.

Across the world, many countries have developed independent satellite navigation systems for economic and military reasons. Although the United States Global Positioning System (GPS) is most widely used and famous, the European Union's Galileo system, the Russian GLONASS, the Chinese COMPASS system, and the Japanese QZSS system (which will be expanded to the JRANS system in the future) are also being currently operated or developed.

Since satellite navigation signals should be robust to interference and jamming, various and elaborate modulation schemes have been employed. It is worthy of notice that the majority of the next-generation satellite navigation systems have replaced a conventional a phase shift keying (PSK) modulation scheme or have employed a BOC modulation scheme in addition to a PSK modulation scheme. The width of the main peak of an auto-correlation function used for the BOC modulation scheme is short, and thus the BOC modulation scheme exhibits better signal tracking performance than the PSK modulation scheme.

Furthermore, the BOC modulation scheme is characterized in that spectral separation occurs and energy is shifted from the center of a band to the periphery thereof, unlike the PSK modulation scheme, and thus the BOC modulation scheme can be additionally applied to a band in which a conventional modulation scheme has been used. Using these characteristics, the next-generation satellite navigation systems can employ the BOC modulation scheme in addition to the PSK modulation scheme, thereby being able to ensure the improvement of performance and backward compatibility.

A BOC signal is a signal that is expressed as a product of a pseudo random noise (PRN) code with a sine or cosine rectangular sub-carrier. A BOC signal is expressed as a $BOC_{sin}(kn,n)$ or a $BOC_{cos}(kn,n)$ depending on the type of sub-carrier, where k is a positive integer indicative of the ratio of the chip period of a PRN code to the period of a sub-carrier, and n is indicative of the ratio of PRN code chip transmission rate to 1.023 MHz, that is, the clock frequency of a CA code.

Although a BOC signal has high signal tracking performance and excellent compatibility with the conventional PSK modulation scheme, it is problematic in that many side peaks occur around a main peak where an auto-correlation function has the highest value, unlike the PSK scheme having a single peak. A problem in which, upon tracking a BOC signal, synchronization is established with a side peak instead of a main peak due to the presence of side peaks, that is, the so-called ambiguity problem, may occur.

Meanwhile, in order to modernize the GPS system while maintaining its backward compatibility and provide compatibility between the GPS system and the Galileo system, a multiplexed BOC(MBOC) modulation method was proposed, and the U.S. and European authorities finally decided to adopt a so-called MBOC(6,1,111) modulation method in which a $BOC_{sin}(1,1)$ signal and a $BOC_{sin}(6,1)$ signal were combined at a power split ratio of 1/11 after discussion.

Interestingly, the U.S. and European authorities implemented different methods of synthesizing sub-carrier signals BOC(1,1) and BOC(6,1) that could satisfy the power spectrum density of the MBOC(6,1,111) modulation method. First, the U.S. authority implemented a time-multiplexed BOC (TMBOC) using two sub-carriers BOC(1,1) and BOC (6,1) in the time domain in an non-overlap manner. In contrast, the European authority implemented a composite BOC (CBOC) in which a sub-carrier BOC(6,1) has been added to a sub-carrier BOC(1,1) along the time axis.

Meanwhile, the TMBOC modulated signal is configured such that 75% of power is assigned to pilot components and 25% of the power is assigned to data components, thereby allowing BOC(1,1) spreading symbols to be used for data having no advantage attributable to high sub-carrier frequency. In contrast, the pilot components are configured to include 29/33 BOC(1,1) spreading symbols and 4/33 BOC(6, 1) spreading symbols, and thus an advantage attributable to the high frequency of a sub-carrier can be obtained via pilot components and also signal tracking performance can be improved.

Furthermore, the pilot components of the TMBOC modulated signal are stipulated such that BOC(6,1) spreading symbols are located at the four chip locations of the Nos. 1, 5, 7 and 30 chips of every 33 chips and BOC(1,1) spreading symbols are located at the remaining 29 chip locations (which is expressed as a TMBOC(6,1,4/33)). This 33 chip pattern is repeated 310 times, and thus a spreading code has a 10230 chip length.

The TMBOC(6,1,4/33) signal includes $BOC_{sin}(6,1)$ signal components at the ratio of 4 chips to 33 chips. Since the main peak of the auto-correlation function of the $BOC_{sin}(6,1)$ signal components is sharper than the main peak of the auto-correlation function of the $BOC_{sin}(1,1)$ signal component, more excellent positioning accuracy can be provided.

However, the TMBOC(6,1,4/33) signal still has side peaks around the main peak of an auto-correlation function, and thus the ambiguity problem still remains.

SUMMARY

Some embodiments of the present invention are directed for the provision of a method of generating an unambiguous correlation function for a TMBOC(6,1,4/33) signal based on partial correlation functions, an apparatus for tracking a TMBOC signal, and a satellite navigation signal receiver system using the same.

Some embodiments of the present invention are directed for the provision of a method of generating an unambiguous correlation function for a TMBOC(6,1,4/33) signal based on partial correlation functions, an apparatus for tracking a TMBOC signal, and a satellite navigation signal receiver system using the same, into which conventional BOC signal tracking schemes that are applied to a $BOC_{sin}(kn,n)$ or $BOC_{cos}(kn,n)$ signal have been developed.

Some embodiments of the present invention are directed for the provision of a method of generating an unambiguous correlation function for a TMBOC(6,1,4/33) signal based on partial correlation functions, an apparatus for tracking a TMBOC signal, and a satellite navigation signal receiver system using the same, which have been developed based on the unique characteristics of a TMBOC signal without using a conventional correlation function generation scheme developed for a BOC signal.

In accordance with an aspect of the present invention, there is provided a delay lock loop (DLL), including a local signal generation unit configured to generate an early and late delayed signal pair $m(t+\tau+\Delta/2)$ and $m(t+\tau-\Delta/2)$, early and late delayed, respectively, based on a phase delay $\tau$ and a delay value difference $\Delta$, with respect to the signal pulse train of a TMBOC(6,1,4/33)-modulated received signal m(t); early and late correlation units configured to generate early BOC(1,1) partial correlation functions $\{P_x^\alpha(\tau+\Delta/2)\}_{x=0}^{1}$ and early BOC(6,1) partial correlation functions $\{P_y^\beta(\tau+\Delta/2)\}_{y=0}^{11}$, and late BOC(1,1) partial correlation functions $\{P_x^\alpha(\tau-\Delta/2)\}_{x=0}^{1}$ and late BOC(6,1) partial correlation functions $\{P_y^\beta(\tau-\Delta/2)\}_{y=0}^{11}$, by performing an auto-correlation operation on the early and late mixed signal pairs $m(t+\tau+\Delta/2)$ and $m(t+\tau-\Delta/2)$ with respect to a total time $T(0\le t\le T)$; early and late BOC(1,1) sub-correlation units configured to generate early and late BOC(1,1) sub-correlation functions $S_0^\alpha(\tau+\Delta/2)$ and $S_0^\alpha(\tau-\Delta/2)$ by performing an elimination operation on the early BOC(1,1) partial correlation functions $\{P_x^\alpha(\tau+\Delta/2)\}_{x=0}^{1}$ and $\{P_x^\alpha(\tau-\Delta/2)\}_{x=0}^{1}$; an early BOC(6,1) sub-correlation unit configured to obtain a first early intermediate correlation function $Q_0^\beta(\tau+\Delta/2)$ by performing an elimination operation on the first and twelfth early BOC(6,1) partial correlation functions $P_0^\beta(\tau+\Delta/2)$ and $P_{11}^\beta(\tau+\Delta/2)$ of the 12 early BOC(6,1) partial correlation functions $\{P_y^\beta(\tau+\Delta/2)\}_{y=0}^{1}$, to obtain second to eleventh early intermediate correlation functions $\{Q_n^\beta(\tau+\Delta/2)\}_{n=1}^{10}$ by performing an elimination operation on the second to eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, and to generate the early BOC(6,1) sub-correlation function $S_0^\beta(\tau+\Delta/2)$ by summing all the first to eleventh early intermediate correlation functions $\{Q_n^\beta(\tau+\Delta/2)\}_{n=0}^{10}$; a late BOC(6,1) sub-correlation unit configured to obtain a first late intermediate correlation function $Q_0^\beta(\tau-\Delta/2)$ by performing an elimination operation on the first and twelfth late BOC(6,1) partial correlation functions $P_0^\beta(\tau-\Delta/2)$ and $P_{11}^\beta(\tau-\Delta/2)$ of the 12 late BOC(6,1) partial correlation functions $\{P_y^\beta(\tau-\Delta/2)\}_{y=0}^{11}$, to obtain second to eleventh late intermediate correlation functions $\{Q_n^\beta(\tau-\Delta/2)\}_{n=1}^{10}$ by performing an elimination operation on the second to eleventh late BOC(6,1) partial correlation functions $\{P_y^\beta(\tau-\Delta/2)\}_{y=1}^{10}$ and the first late intermediate correlation function $Q_0^\beta(\tau-\Delta/2)$, and to generate a late BOC(6,1) sub-correlation function $S_0^\beta(\tau-\Delta/2)$ by summing all the first to eleventh late intermediate correlation functions $\{Q_n^\beta(\tau-\Delta/2)\}_{n=0}^{10}$; early and late combination units configured to generate an early main correlation function $R_{proposed}(\tau+\Delta/2)$ by summing the early BOC(1,1) sub-correlation function $S_0^\alpha(\tau+\Delta/2)$ and the early BOC(6,1) sub-correlation function $S_0^\beta(\tau+\Delta/2)$, and to generate a late main correlation function $R_{proposed}(\tau-\Delta/2)$ by summing the late BOC(1,1) sub-correlation function $S_0^\alpha(\tau-\Delta/2)$ and the late BOC(6,1) sub-correlation function $S_0^\beta(\tau-\Delta/2)$; and a numerical control oscillator (NCO) configured to determine a phase delay $\tau$ for the received signal based on a discrimination output of a discrimination function based on values of the early and late main correlation functions, and to output the determined phase delay $\tau$ to the local signal generation unit; wherein the elimination operation is an operation satisfying algebraic relations in which $|A|+|B|-|A-B|=0$ when real numbers A and B are $AB \le 0$ and $|A|+|B|-|A-B|>0$ when the real numbers A and B are $AB>0$.

The early BOC(1,1) partial correlation functions $\{P_x^\alpha(\tau+\Delta/2)\}_{x=0}^{1}$ and the early BOC(6,1) partial correlation functions $\{P_y^\beta(\tau+\Delta/2)\}_{y=0}^{11}$, and the late BOC(1,1) partial correlation functions $\{P_x^\alpha(\tau-\Delta/2)\}_{x=0}^{1}$ and the late BOC(6,1) partial correlation functions $\{P_y^\beta(\tau-\Delta/2)\}_{y=0}^{11}$ may be based on the following equation:

$$R(\tau) = \frac{1}{PT}\int_0^T m(t)m(t+\tau)dt$$

$$= \sum_{x=0}^{1}\sum_{i=-\infty}^{\infty}\frac{1}{T\sqrt{P}}\int_0^T m(t)h_i r_{T_c}(t+\tau-iT_c)p_x^\alpha(t+\tau)dt +$$

$$\sum_{y=0}^{11}\sum_{i=-\infty}^{\infty}\frac{1}{T\sqrt{P}}\int_0^T m(t)h_i r_{T_c}(t+\tau-iT_c)p_y^\beta(t+\tau)dt$$

$$= \sum_{x=0}^{1} p_x^\alpha(\tau) + \sum_{x=0}^{11} p_y^\beta(\tau)$$

where P is the power of the TMBOC modulated signal, $h_i \in \{-1, 1\}$ is the i-th chip of a PRN code having a period T, $T_c$ is the chip period of the PRN code, $r_{T_c}(t)$ is a unit square wave present in $[0, T_c]$, and $p_x^\alpha(t)$ and $p_x^\beta(t)$ are the two BOC(1,1) partial sub-carrier components $p_x^\alpha(t)$ and 12 BOC(6,1) partial sub-carrier components $p_x^\beta(t)$ of the TMBOC(6,1,4/33) signal.

The early BOC(1,1) sub-correlation function $S_0^\alpha(\tau+\Delta/2)$ or the late BOC(1,1) sub-correlation function $S_0^\alpha(\tau-\Delta/2)$ may be generated based on the following equation:

$$S_0^\alpha(\tau)=|P_0^\alpha(\tau)|+|P_1^\alpha(\tau)|-|P_0^\alpha(\tau)-P_1^\alpha(\tau)|$$

The first early intermediate correlation function $Q_0^\beta(\tau+\Delta/2)$ and the first late intermediate correlation function $Q_0^\beta(\tau-\Delta/2)$ may be generated based on the following Equation:

$$Q_0^\alpha(\tau)=|P_0^\beta(\tau)|+|P_{11}^\beta(\tau)|-|P_0^\beta(\tau)-P_{11}^\beta(\tau)|;$$

the second to eleventh early and late intermediate correlation functions $\{Q_n^\beta(\tau+\Delta/2)\}_{n=1}^{10}$ and the second to eleventh late intermediate correlation functions $\{Q_n^\beta(\tau-\Delta/2)\}_{n=1}^{10}$ may be generated based on the following Equation:

$$Q_n^\alpha(\tau)=|Q_0^\beta(\tau)|+|P_{y=n}^\beta(\tau)|-|Q_0^\beta(\tau)-P_{y=n}^\beta(\tau)|; \text{ and}$$

the early BOC(6,1) sub-correlation function $S_0^\beta(\tau+\Delta/2)$ and the late BOC(6,1) sub-correlation function $S_0^\beta(\tau-\Delta/2)$ may be generated based on the following equation:

$$S_0^\beta(\tau) = \sum_{n=0}^{10} Q_n^\beta(\tau)$$

The discrimination function may be defined by the following equation:

$$D(\tau) = R_{proposed}^2\left(\tau+\frac{\Delta}{2}\right) - R_{proposed}^2\left(\tau-\frac{\Delta}{2}\right)$$

In accordance with another aspect of the present invention, there is provided a method of tracking a TMBOC(6,1,4/33)

signal, including generating an early and late delayed signal pair $m(t+\tau+\Delta/2)$ and $m(t+\tau-\Delta/2)$, early and late delayed, respectively, based on a phase delay $\tau$ and a delay value difference $\Delta$, with respect to a signal pulse train of a TMBOC (6,1,4/33)-modulated received signal $m(t)$; generating early BOC(1,1) partial correlation functions $\{P_x^\alpha(\tau+\Delta/2)\}_{x=0}^1$ and early BOC(6,1) partial correlation functions $\{P_y^\beta(\tau+\Delta/2)\}_{y=0}^{11}$, and late BOC(1,1) partial correlation functions $\{P_x^\alpha(\tau-\Delta/2)\}_{x=0}^1$ and late BOC(6,1) partial correlation functions $\{P_y^\beta(\tau-\Delta/2)\}_{y=0}^{11}$ by performing an auto-correlation operation on the early and late mixed signal pairs $m(t+\tau+\Delta/2)$ and $m(t+\tau-\Delta/2)$ with respect to a total time $T(0 \leq t \leq T)$; generating early and late BOC(1,1) sub-correlation functions $S_0^\alpha(\tau+\Delta/2)$ and $S_0^\alpha(\tau-\Delta/2)$ by performing an elimination operation on the early BOC(1,1) partial correlation functions $\{P_x^\alpha(\tau+\Delta/2)\}_{x=0}^1$ and $\{P_x^\alpha(\tau-\Delta/2)\}_{x=0}^1$; obtaining a first early intermediate correlation function $Q_0^\beta(\tau+\Delta/2)$ by performing an elimination operation on the first and twelfth early BOC (6,1) partial correlation functions $P_0^\beta(\tau+\Delta/2)$ and $P_{11}^\beta(\tau+\Delta/2)$ of the 12 early BOC(6,1) partial correlation functions $\{P_y^\beta(\tau+\Delta/2)\}_{y=0}^{11}$, obtaining second to eleventh early intermediate correlation functions $\{Q_n^\beta(\tau+\Delta/2)\}_{n=1}^{10}$ by performing an elimination operation on the second to eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, and generating the early BOC(6,1) sub-correlation function $S_0^\beta(\tau+\Delta/2)$ by summing all the first to eleventh early intermediate correlation functions $\{Q_n^\beta(\tau+\Delta/2)\}_{n=0}^{10}$; obtaining a first late intermediate correlation function $Q_0^\beta(\tau-\Delta/2)$ by performing an elimination operation on the first and twelfth late BOC(6,1) partial correlation functions $P_0^\beta(\tau-\Delta/2)$ and $P_{11}^\beta(\tau-\Delta/2)$ of the 12 late BOC(6,1) partial correlation functions $\{P_y^\beta(\tau-\Delta/2)\}_{y=0}^{11}$, obtaining second to eleventh late intermediate correlation functions $\{Q_n^\beta(\tau-\Delta/2)\}_{n=1}^{10}$ by performing an elimination operation on the second to eleventh late BOC(6,1) partial correlation functions $\{P_y^\beta(\tau-\Delta/2)\}_{y=1}^{10}$ and the first late intermediate correlation function $Q_0^\beta(\tau-\Delta/2)$, and generating a late BOC (6,1) sub-correlation function $S_0^\beta(\tau-\Delta/2)$ by summing all the first to eleventh late intermediate correlation functions $\{Q_n^\beta(\tau-\Delta/2)\}_{n=0}^{10}$; generating an early main correlation function $R_{proposed}(\tau+\Delta/2)$ by summing the early BOC(1,1) sub-correlation function $S_0^\alpha(\tau+\Delta/2)$ and the early BOC(6,1) sub-correlation function $S_0^\beta(\tau+\Delta/2)$, and generating a late main correlation function $R_{proposed}(\tau-\Delta/2)$ by summing the late BOC (1,1) sub-correlation function $S_0^\alpha(\tau-\Delta/2)$ and the late BOC (6,1) sub-correlation function $S_0^\beta(\tau-\Delta/2)$; and determining a phase delay $\tau$ for the received signal based on a discrimination output of a discrimination function based on values of the early and late main correlation functions, and to output the determined phase delay $\tau$ to the local signal generation unit; wherein the elimination operation is an operation satisfying an algebraic relation in which $|A|+|B|-|A-B|=0$ when real numbers A and B are $AB \leq 0$.

In accordance with still another aspect of the present invention, there is provided a method of generating a correlation function of a TMBOC(6,1,4/33) signal, including generating a delayed signal $m(t+\tau)$ delayed based on a phase delay $\tau$ with respect to a signal pulse train of a TMBOC(6,1,4/33)-modulated received signal $m(t)$; generating BOC(1,1) partial correlation functions $P_x^\alpha(\tau)$ and BOC(6,1) partial correlation functions $P_y^\beta(\tau)$ by performing an auto-correlation operation on the received signal $m(t)$ and the delayed signal $m(t+\tau)$ with respect to a total time $T(0 \leq t \leq T)$; generating a BOC(1,1) sub-correlation function $S_0^\alpha(\tau)$ by performing an elimination operation on the BOC(1,1) partial correlation functions $P_0^\alpha(\tau)$ and $P_1^\alpha(\tau)$; obtaining a first intermediate correlation function $Q_0^\beta(\tau)$ by performing an elimination operation on the first and twelfth BOC(6,1) partial correlation functions $P_0^\beta(\tau)$ and $P_{11}^\beta(\tau)$ of the 12 BOC(6,1) partial correlation functions $\{P_y^\beta(\tau)\}_{y=0}^{11}$, obtaining second to eleventh intermediate correlation functions $\{Q_n^\beta(\tau)\}_{n=1}^{10}$ by performing an elimination operation on the second to eleventh BOC(6,1) partial correlation functions $\{P_y^\beta(\tau)\}_{y=1}^{10}$ and the first intermediate correlation function $Q_0^\beta(\tau)$, and generating the BOC(6,1) sub-correlation function $S_0^\beta(\tau)$ by summing all the first to eleventh intermediate correlation functions $\{Q_n^\beta(\tau)\}_{n=0}^{10}$; and generating a main correlation function $R_{proposed}(\tau)$ by summing the BOC(1,1) sub-correlation function $S_0^\alpha(\tau)$ and the BOC(6,1) sub-correlation function $S_0^\beta(\tau)$; wherein the elimination operation is an operation satisfying algebraic relations in which $|A|+|B|-|A-B|=0$ when real numbers A and B are $AB \leq 0$ and $|A|+|B|-|A-B|>0$ when the real numbers A and B are $AB>0$.

In accordance with still another aspect of the present invention, there is provided an apparatus for tracking a TMBOC signal, including a frequency offset compensation unit configured to output a compensated received signal compensated for frequency offset of a carrier frequency based on a carrier frequency compensation value with respect to a TMBOC(6, 1,4/33)-modulated received signal; a local code generation unit configured to generate a delay-compensated local code based on a code delay value; a mixer configured to mix the delay-compensated local code with the frequency offset-compensated received signal; a DLL configured to repeatedly track and calculate a code delay value that allows a correlation value obtained by correlating the delay-compensated local signal and the frequency offset-compensated received signal with each other is located at an apex of a main peak of a correlation function, and to provide the calculated code delay value to the local code generation unit; a phase lock loop (PLL) configured to repeatedly calculate a carrier frequency compensation value based on an auto-correlation value of a local code, based on the tracked code delay value, so that a phase error of a carrier signal can be minimized, and to provide the carrier frequency compensation value to the frequency offset compensation unit; and a data extraction unit configured to extract spreading data from a mixture of the delay-compensated local code and the compensated received signal; wherein the DLL operates to generate a BOC(1,1) sub-correlation function by performing an elimination operation on a partial correlation function pair of BOC(1,1) components among partial correlation functions constituting an auto-correlation function of a TMBOC(6,1,4/33)-modulated received signal, generate a BOC(6,1) sub-correlation function by summing a first intermediate correlation function generated by performing an elimination operation on a first and twelfth partial correlation function pair of the BOC(6,1) components and second to eleventh intermediate correlation functions generated by performing an elimination operation on second to eleventh partial correlation functions of the BOC(6,1) components and the first intermediate correlation function, and generate a main correlation function by combining the BOC(1,1) sub-correlation function and the BOC (6,1) sub-correlation function; and wherein the elimination operation is an operation satisfying algebraic relations in which $|A|+|B|-|A-B|=0$ when real numbers A and B are $AB \leq 0$ and $|A|+|B|-|A-B|>0$ when the real numbers A and B are $AB>0$.

The data extraction unit may operate to extract satellite navigation data and to estimate a pseudorange based on the extracted satellite navigation data.

In accordance with still another aspect of the present invention, there is provided a satellite navigation signal receiver system, including a front end unit configured to output a received signal obtained by TMBOC(6,1,4/33)-modulating a signal in space (SIS) received from an antenna; a baseband processing unit configured to acquire and track a code delay value with respect to the output received signal using a DLL, to compensate for carrier frequency offset using a PLL, and to extract the contained data from a code delay-compensated local code and a frequency offset-compensated compensated received signal; and an application function processing unit configured to perform a predetermined application function based on the extracted contained data; wherein the baseband processing unit operates to generate a delayed signal $m(t+\tau)$ delayed based on a phase delay $\tau$ with respect to a signal pulse train of a TMBOC(6,1,4/33)-modulated received signal $m(t)$; generate BOC(1,1) partial correlation functions $P_x^{\alpha}(\tau)$ and BOC(6,1) partial correlation functions $P_y^{\beta}(\tau)$ by performing an auto-correlation operation on the received signal $m(t)$ and the delayed signal $m(t+\tau)$ with respect to a total time $T(0 \leq t \leq T)$; generate a BOC(1,1) sub-correlation function $S_0^{\alpha}(\tau)$ by performing an elimination operation on the BOC(1,1) partial correlation functions $P_0^{\alpha}(\tau)$ and $P_1^{\alpha}(\tau)$; obtain a first intermediate correlation function $Q_0^{\beta}(\tau)$ by performing an elimination operation on the first and twelfth BOC(6,1) partial correlation functions $P_0^{\beta}(\tau)$ and $P_{11}^{\beta}(\tau)$ of the 12 BOC (6,1) partial correlation functions $\{P_y^{\beta}(\tau)\}_{y=0}^{11}$, obtain second to eleventh intermediate correlation functions $\{Q_n^{\beta}(\tau)\}_{n=1}^{10}$ by performing an elimination operation on the second to eleventh BOC(6,1) partial correlation functions $\{P_y^{\beta}(\tau)\}_{y=1}^{10}$ and the first intermediate correlation function $Q_0^{\beta}(\tau)$, and generate the BOC(6,1) sub-correlation function $S_0^{\beta}(\tau)$ by summing all the first to eleventh intermediate correlation functions $\{Q_n^{\beta}(\tau)\}_{n=0}^{10}$; generate a main correlation function $R_{proposed}(\tau)$ by summing the BOC(1,1) sub-correlation function $S_0^{\beta}(\tau)$ and the BOC(6,1) sub-correlation function $S_0^{\beta}(\tau)$; and, if it is determined that a main correlation function value based on the phase delay $\tau$ is located at the apex of the main peak based on a filtered discrimination output, output the value of the phase delay $\tau$ at the time as a code delay value; wherein the elimination operation is an operation satisfying algebraic relations in which $|A|+|B|-|A-B|=0$ when real numbers A and B are $AB \leq 0$ and $|A|+|B|-|A-B|>0$ when the real numbers A and B are $AB>0$.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
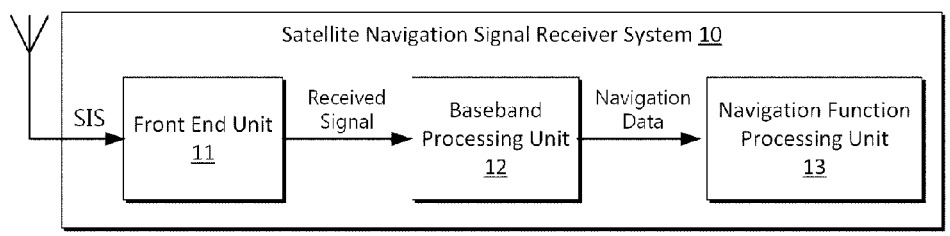
FIG. 1 is a block diagram illustrating a satellite navigation signal receiver system according to an embodiment of the present invention.

With regard to embodiments of the present invention disclosed herein, specific structural and functional descriptions are given merely for the purpose of illustrating the embodiments of the present invention. Embodiments of the present invention may be practiced in various forms, and the present invention should not be construed as being limited to embodiments disclosed herein.

Embodiments of the present invention will be described in detail below with reference to the accompanying drawings. The same reference numerals will be used to denote the same components throughout the accompanying drawings, and descriptions of the same components will be omitted.

FIG. 1 is a block diagram illustrating a satellite navigation signal receiver system 10 according to an embodiment of the present invention.

Referring to FIG. 1, the satellite navigation signal receiver system 10 includes an antenna, a front end unit 11, a baseband processing unit 12, and a navigation function processing unit 13.

A signal in space (SIS) emitted from a navigation satellite and received by the antenna is subjected to tuning, down conversion, filtering, amplification, and digital sampling by the front end unit 11, and is then output as a digital received signal.

The baseband processing unit 12 may acquire and track code delay using a delay lock loop (DLL) for acquiring and tracking signal synchronization based on a signal correlation technique with respect to the output received signal, may compensate for carrier frequency offset using a phase lock loop (PLL) in order to compensate for the fading or Doppler effect, and may extract synchronized satellite navigation data from a code delay-compensated local signal and a frequency offset-compensated received signal.

In particular, the baseband processing unit 12 may generate the pseudorange from the satellite to the satellite navigation signal receiver system 10 based on the satellite navigation data, and may output the pseudorange.

Furthermore, the baseband processing unit 12 may extract phase measurement data, satellite location data (almanac), satellite clock information, satellite orbit data (ephemeris), etc. from the compensated received signal, in addition to the pseudorange.

In this case, as will be described below, the baseband processing unit 12 of the satellite navigation signal receiver system 10 according to the present embodiment generates a main correlation function by combining a BOC(1,1) sub-correlation function and a BOC(6,1) sub-correlation function, the BOC(1,1) sub-correlation function being generated by performing an elimination operation on the partial correlation function pair of BOC(1,1) components among partial correlation functions constituting the auto-correlation function of a TMBOC(6,1,4/33)-modulated received signal, the BOC(6,1) sub-correlation function being generated by summing a first intermediate correlation function generated by performing an elimination operation on the first and twelfth partial correlation function pair of the BOC(6,1) components and second to eleventh intermediate correlation functions generated by performing an elimination operation on the second to eleventh partial correlation functions of the BOC (6,1) components and the first intermediate correlation function, and then may accurately acquire and track code phase delay based on the main correlation function having only a main peak.

The navigation function processing unit 13 may calculate the coordinates and movement of the receiver system 10 based on pseudoranges obtained for a plurality of satellites.

In this case, for example, the navigation function processing unit 13 may calculate the 2D coordinates of the satellites navigation receiver system 10 from the pseudoranges obtained for three satellites, and may calculate 3D coordinates from the pseudoranges obtained for at least four satellites.

Figure 2:
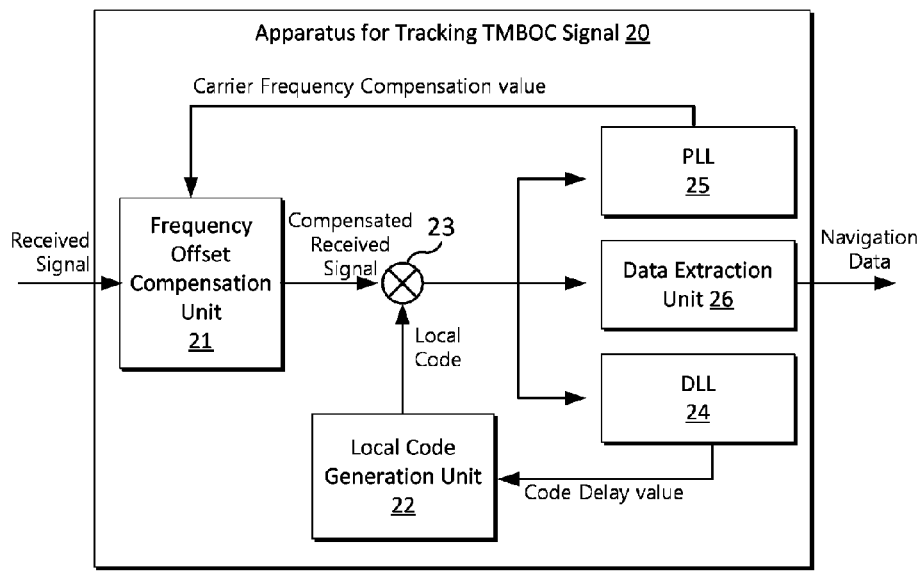
FIG. 2 is a block diagram illustrating an apparatus for tracking a TMBOC signal according to an embodiment of the present invention.

FIG. 2 is a block diagram illustrating an apparatus for tracking a TMBOC signal according to an embodiment of the present invention.

The baseband processing unit 12 of the satellite navigation signal receiver system 10 of FIG. 1 may acquire and track code delay using circuits, such as an apparatus for tracking a TMBOC signal 20 illustrated in FIG. 2.

Referring to FIG. 2, the apparatus 20 for tracking a TMBOC signal may include a frequency offset compensation unit 21, a local code generation unit 22, a mixer 23, a DLL 24, a PLL 25, and a data extraction unit 26.

When the apparatus 20 for tracking a TMBOC signal receives a TMBOC received signal, it takes time for the TMBOC received signal to reach the receiver system 10, and carrier frequency offset occurs during the propagation of the radio signal due to the fading or Doppler effect. Accordingly, in order to accurately track and demodulate the TMBOC received signal, a code delay value and carrier frequency offset should be known.

Since it is impossible to know a code delay value and a frequency offset value or they should be inaccurately estimated when a TMBOC signal is received first, the code delay value should be determined or a carrier frequency should be compensated via the DLL 24 or PLL 25.

First, the frequency offset compensation unit 21 outputs a compensated received signal obtained by compensating the TMBOC received signal for carrier frequency fading or frequency offset attributable to the Doppler effect based on a carrier frequency compensation value provided by the PLL 25. Since there is no information used to compensate for calculated carrier frequency offset in the beginning stage, a default value or a previous estimated value may be applied.

The local code generation unit 22 generates a delay-compensated local code based on a code delay value that is calculated by the DLL 24. Since there is no calculated code delay value in the beginning stage, a default value or a previous estimated value may be applied.

The mixer 23 mixes the delay-compensated local code and the frequency deviation-compensated compensated received signal.

The DLL 24 repeatedly tracks and calculates a code delay value that allows a correlation value, obtained by performing a predetermined correlation operation on the delayed received signal based on the compensated received signal and a predetermined code delay value, to be located at the main peak of a main correlation function, and provides the calculated code delay value to the local code generation unit 22.

More specifically, as will be described in detail later, the DLL 24 may generate a main correlation function by combining a BOC(1,1) sub-correlation function and a BOC(6,1) sub-correlation function, the BOC(1,1) sub-correlation function being generated by performing an elimination operation on the partial correlation function pair of BOC(1,1) components among partial correlation functions constituting the auto-correlation function of a TMBOC(6,1,4/33)-modulated received signal, the BOC(6,1) sub-correlation function being generated by summing a first intermediate correlation function generated by performing an elimination operation on the first and twelfth partial correlation function pair of the BOC (6,1) components and second to eleventh intermediate correlation functions generated by performing an elimination operation on the second to eleventh partial correlation functions of the BOC(6,1) components and the first intermediate correlation function.

In this case, as will be described in connection with Equation 5, throughout the present specification and the attached claims, an elimination operation refers to an operation based on algebraic relations in which $|A|+|B|-|A-B|=0$ if real numbers A and B satisfy $xy \leq 0$ and $|A|+|B|-|A-B|>0$ if the real numbers A and B satisfy $AB>0$.

The main correlation function according to the present invention can eliminate all side peaks, other than a main peak, and is sharper at its center and has a main peak having a larger height than an auto-correlation function, thereby being able to improve tracking performance.

The PLL 25 repeatedly compensates a carrier frequency based on the auto-correlation value of the local code, based on the tracked code delay value, so that the phase error of a carrier signal can be minimized, and then provides a carrier frequency compensation value to the frequency offset compensation unit 21.

After the compensated received signal has been appropriately acquired and tracked, the data extraction unit 26 may accurately extract synchronized data, such as satellite navigation data modulated into a PRN code on a satellite side, from a mixture of the delay-compensated local code and the frequency deviation-compensated compensated received signal.

Furthermore, the data extraction unit 26 may estimate the pseudorange to the satellite based on the extracted satellite navigation data.

Figure 3:
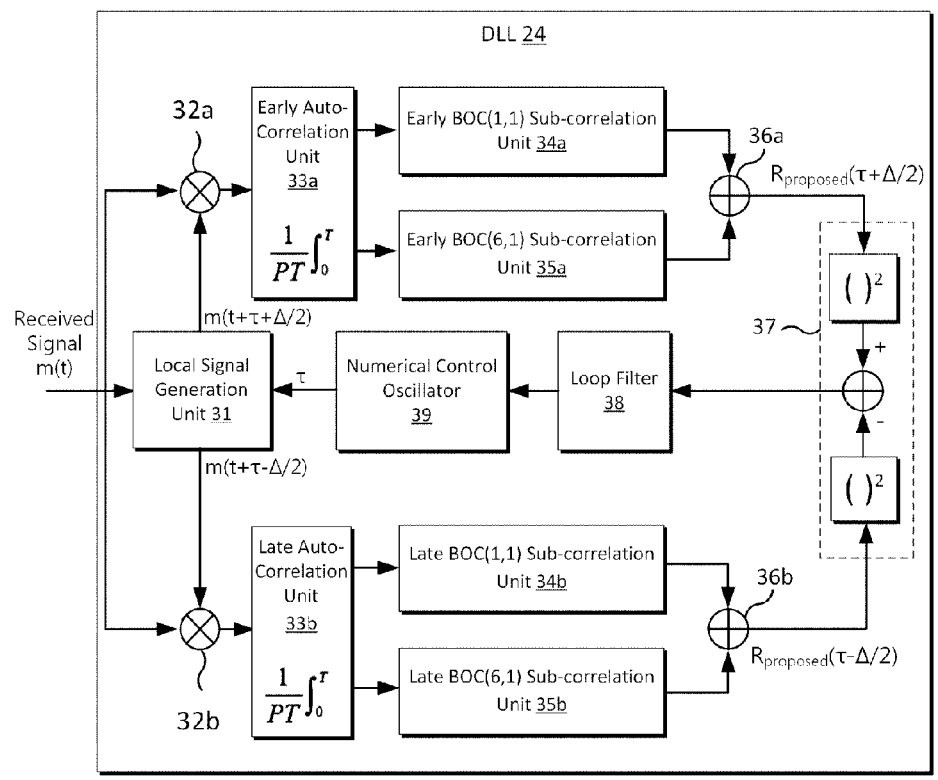
FIG. 3 is a block diagram illustrating the DLL of the apparatus for tracking a TMBOC signal according to the present embodiment.

FIG. 3 is a block diagram illustrating the DLL 24 of the apparatus for tracking a TMBOC signal according to the present embodiment.

More specifically, the DLL 24 includes a local signal generation unit 31, early and late mixers 32a and 32b, early and late auto-correlation units 33a and 33b, early and late BOC (1,1) sub-correlation units 34a and 34b, early and late BOC (6,1) sub-correlation units 35a and 35b, early and late combination units 36a and 36b, a discriminator mixer 37, a loop filter 38, and a numerical control oscillator (NCO) 39.

The conventional apparatus for tracking a TMBOC signal performs: a correlation operation on priori known spreading codes, provided by the local signal generation unit, and the received signal and then acquire a spreading code having the largest correlation value and its synchronization, at the step of acquiring the spreading code and its synchronization; and outputs the delayed received signal via a local code generation unit, performs auto-correlation on the delayed received signal and the received signal, and then finds a code delay phase that exhibits a main peak having the largest correlation value, at the step of tracking code delay after the acquisition.

As described above, the auto-correlation function of a TMBOC signal has a plurality of side peaks. In order to overcome this problem, first, the early and late BOC(1,1) sub-correlation units 34a and 34b according to the present embodiment obtain a BOC(1,1) sub-correlation function by performing an elimination operation on two partial correlation functions constituting the auto-correlation function of the received signal, instead of using the auto-correlation function of the received signal without change.

Next, in the same manner, the early and late BOC(6,1) sub-correlation units 35a and 35b according to the present embodiment obtain a BOC(6,1) sub-correlation function by summing a first intermediate correlation function and second to eleventh intermediate correlation functions, instead of using the auto-correlation function of the received signal, wherein the first intermediate correlation function is generated by performing an elimination operation on the first and twelfth partial correlation functions of 12 partial correlation functions constituting the auto-correlation function of the received signal, and the second to eleventh intermediate correlation functions are generated by performing an elimination operation on each of the second to eleventh partial correlation functions of the BOC(6,1) components and the first intermediate correlation function.

Thereafter, the early and late combination units 36a and 36b according to the present embodiment may provide a main correlation function having only a main peak by interposing the BOC(1,1) sub-correlation function and the BOC(6,1) sub-correlation function.

In this case, the auto-correlation operation refers to an operation that multiplies a sampled signal X(t+τ) by a signal X(t) while gradually changing the delay time τ of the signal X(t) with respect to the signal X(t). Generally, when the signal X(t) repeats a specific pattern, the auto-correlation value of the signals X(t) and the X(t+τ) appears to be considerably large if the delay time τ is equal to the period of the pattern and appears to be small (that is, the correlation function appears in the form of a peak) if the delay time τ is not equal to the period of the pattern. Accordingly, when time delay for which the result of the auto-correlation operation appears to be largest is found, the value of the found time delay is the period of the signal X(t).

If a signal X(t) is a preamble indicative of the start of a synchronized signal, signal synchronization may be coarsely acquired using an auto-correlation operation.

Furthermore, after the signal synchronization has been acquired, signal synchronization may be finely tracked via an auto-correlation operation.

In general, there are some techniques for tracking the apex of the peak of a correlation function. For example, there is a technique using the aspect of changes in the values of prompt correlation based on currently applied delay time, early correlation preceding the prompt correlation, and late correlation following the prompt correlation.

For example, if correlation values appear in order of early correlation, prompt correlation and late correlation or in reverse order, the prompt correlation may be viewed as being located on a slope of a peak. If the correlation value of prompt correlation is highest and the values of early correlation and late correlation are lower than the former value, this means that the prompt correlation is located near the apex of a peak.

As described above, in the TMBOC(6,1,4/33) modulation technique, 25% of power is assigned to a data signal component, and 75% of power is assigned to a pilot signal component. The data signal component includes only $BOC_{sin}(1,1)$ $BOC_{sin}(1,1)$ signal, and a TMBOC(6,1,4/33)-modulated received signal is used only in a pilot signal component.

A TMBOC(6,1,4/33) modulated baseband received signal m(t) may be expressed by the following Equation 1:

$$m(t) = \sqrt{P} \sum_{i=-\infty}^{\infty} h_i r_{T_c}(t - iT_c)d(t)p_{sc}(t) \quad (1)$$

where P is the power of a TMBOC-modulated signal, $h_i \in \{-1, 1\}$ is the i-th chip of a code, for example, a PRN code, having a period T, $T_c$ is the chip period of the spreading code, $r_{T_c}(t)$ is a unit square wave present in $[0, T_c]$, and d(t) is navigation data. Meanwhile, a pilot signal component does not have data, and thus the navigation data d(t) is considered to be 1.

$p_{sc}(t)$ is the waveform of a sub-carrier that is present in the PRN code chip of the TMBOC(6,1,4/33) signal. As described above, with regard to a PRN code, symbols at four (Nos. 1, 5, 7 and 30) chip locations that belong to 33 symbols each having a period of $T_c$ are modulated into a BOC(6,1) sub-carrier waveform, and the remaining 29 symbols are modulated into a BOC(1,1) sub-carrier waveform.

When the BOC(1,1) sub-carrier waveform and the BOC(6,1) sub-carrier waveform constituting the sub-carrier $p_{sc}(t)$ are $p_{sc}^\alpha(t)$ and $p_{sc}^\beta(t)$, respectively, as shown in the following Equation 2, the sub-carrier $p_{sc}(t)$ may be expressed by following Equation 3:

$$p_{sc}^\alpha(t) = r_{T_s^\alpha}(t - iT_c) - r_{T_s^\alpha}(t - iT_c - T_s^\alpha), \quad (2)$$

$$p_{sc}^\beta(t) = \sum_{m=0}^{11} (-1)^m \cdot r_{T_s^\beta}(t - iT_c - T_s^\beta)$$

$$p_{sc}(t) = \begin{cases} p_{sc}^\alpha(t), & (i \neq 33k, 33k+4, 33k+6, 33k+29) \\ p_{sc}^\beta(t), & (i = 33k, 33k+4, 33k+6, 33k+29) \end{cases} \quad (3)$$

where $T_s^\alpha(t)$ is the single pulse period of the BOC(1,1) sub-carrier waveform and $T_s^\alpha(t)=T_c/2$, $T_s^\beta(t)$ is the single pulse period of the BOC(6,1) sub-carrier waveform, and k is an integer.

Figure 4:
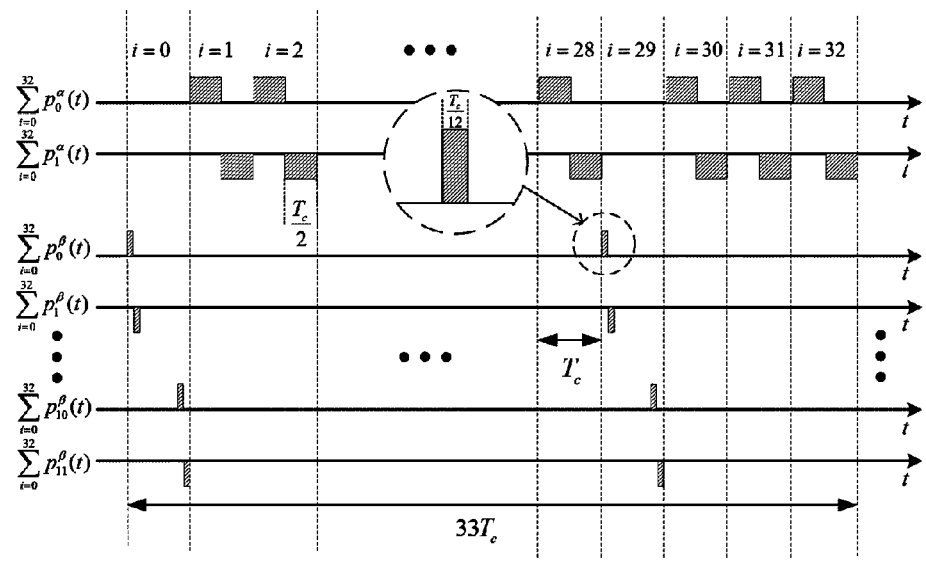
FIG. 4 illustrates pulses constituting pilot components in 33 chip periods in a TMBOC(6,1,4/33) received signal for the apparatus for tracking a TMBOC signal according to the present embodiment.

Referring to FIG. 4 to more specifically illustrate the pulse waveform of the sub-carrier $p_{sc}(t)$, FIG. 4 illustrates pulses constituting pilot components in 33 chip periods in a TMBOC (6,1,4/33) received signal for the apparatus for tracking a TMBOC signal according to the present embodiment.

When repeated 33 chips are observed in the TMBOC(6,1, 4/33) received signal, BOC(6,1) sub-carrier waveforms appear only in intervals satisfying i=0, 4, 6, 29, and BOC(1,1) sub-carrier waveforms appear in the other intervals.

Accordingly, when the TMBOC(6,1,4/33) received signal is resolved into sets of specific pulses, they may be illustrated as in FIG. 4.

First, when data is 1, the BOC(1,1) sub-carrier waveform $p_{sc}^\alpha(t)$ has a waveform of +1 during $T_c/2$ of each period and a waveform of −1 during the remaining $T_c/2$.

Accordingly, the BOC(1,1) sub-carrier waveform $p_{sc}^\alpha(t)$ may be represented by a first BOC(1,1) partial sub-carrier component, that is, a train of +1 pulses $p_0^\alpha(t)$ during the preceding during $T_c/2$ of each period, and a second BOC(1,1) partial sub-carrier component, that is, a train of −1 pulses $p_1^\alpha(t)$ during the remaining $T_c/2$.

Furthermore, the BOC(1,1) sub-carrier waveform $p_{sc}^\beta(t)$ may be represented by a first BOC(6,1) partial sub-carrier component, that is, a train of +1 pulses $p_0^\beta(t)$ during the first $T_c/12$ of each chip period, a second BOC(6,1) partial sub-carrier component, that is, a train of −1 pulses $p_1^\beta(t)$ during the second $T_c/12$ of each chip period, . . . , a eleventh BOC(6,1) partial sub-carrier component, that is, a train of +1 pulses $p_{10}^\beta(t)$ during the eleventh $T_c/12$ of each chip period, and a 12th BOC(6,1) partial sub-carrier component, that is, a train of −1 pulses $p_{11}^\beta(t)$ during the last $T_c/12$ of each chip period.

Using the above two BOC(1,1) partial sub-carrier components $p_x^\alpha(t)$ and the above twelve BOC(6,1) partial sub-carrier waveform components $p_y^\beta(t)$, the normalized auto-correlation function $R(\tau)$ of the TMBOC(6,1,4/33) signal may be represented by simple superposition of two BOC(1,1) partial correlation functions $P_x^\alpha(t)$ and twelve BOC(6,1) partial correlation functions $P_y^\beta(\tau)$ by the following Equation 4:

$$R(\tau) = \frac{1}{PT}\int_0^T m(t)m(t+\tau)dt \quad (4)$$

$$= \sum_{x=0}^{1}\sum_{i=-\infty}^{\infty}\frac{1}{T\sqrt{P}}\int_0^T m(t)h_i r_{T_c}(t+\tau-iT_c)p_x^\alpha(t+\tau)dt +$$

$$\sum_{y=0}^{11}\sum_{i=-\infty}^{\infty}\frac{1}{T\sqrt{P}}\int_0^T m(t)h_i r_{T_c}(t+\tau-iT_c)p_y^\beta(t+\tau)dt$$

$$= \sum_{x=0}^{1}p_x^\alpha(\tau) + \sum_{x=0}^{11}p_y^\beta(\tau)$$

where P is the power of the received signal m(t), and T is the period of the pseudo noise code. It is assumed that the sign +1 or −1 appears with the same probability distribution in the chip of the pseudo noise code, and the period T of the pseudo noise code may be viewed as being considerably longer than the chip period $T_c$.

Next, an unambiguous main correlation function is obtained by performing an elimination operation on and then combining the two BOC(1,1) partial correlation functions $P_x^\alpha(\tau)$ (in this case, x is an integer ranging from 0 to 1) and the twelve BOC(6,1) partial correlation functions $P_y^\beta(\tau)$ (in this case, y is an integer ranging from 0 to 1), as follows.

In particular, throughout the present specification and the claims, the elimination operation refers to algebraic relations, such as the following Equation 5. The remaining waveforms other than central peak segments to be left as a main peak may be eliminated by performing an elimination operation on the partial correlation functions.

$$\begin{cases} |A|+|B|-|A-B|=0, & \text{if } AB \le 0 \\ |A|+|B|-|A-B|>0, & \text{if } AB > 0 \end{cases} \quad (5)$$

In this case, an elimination operation performed on real numbers A and B may be simply expressed as A⊖B.

Figure 5:
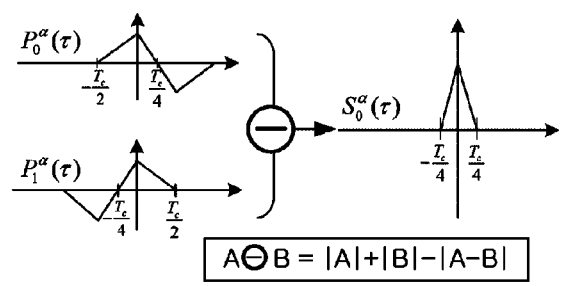
FIG. 5 illustrates two BOC(1,1) partial correlation functions, constituting the auto-correlation function of the BOC(1,1) components of a TMBOC(6,1,4/33) received signal for the apparatus for tracking a TMBOC signal according to the present embodiment, and a BOC(1,1) sub-correlation function.

First, referring to FIG. 5 to illustrate the process of obtaining a BOC(1,1) sub-correlation function that is used to reach a main correlation function based on BOC(1,1) partial correlation functions, FIG. 5 illustrates two BOC(1,1) partial correlation functions, constituting the auto-correlation function of the BOC(1,1) components of a TMBOC(6,1,4/33) received signal for the apparatus for tracking a TMBOC signal according to the present embodiment, and a BOC(1,1) sub-correlation function.

In FIG. 5, a BOC(1,1) sub-correlation function $S_0^\alpha(\tau)$ is obtained by performing an elimination operation on two BOC(1,1) partial correlation functions in $P_0^\alpha(\tau)$ and $P_1^\alpha(\tau)$.

The BOC(1,1) partial correlation function $P_0^\alpha(\tau)$ has a zero-crossing closest to an origin at $T_c/A$, and the remaining BOC(1,1) partial correlation function $P_1^\alpha(\tau)$ has a zero-crossing closest to the origin at $-T_c/A$. It can be observed that the product of the two BOC(1,1) partial correlation functions in $P_0^\alpha(\tau) P_1^\alpha(\tau)$ has a positive value only in the interval $-T_c/A<\tau<T_c/A$, and has 0 or a negative value in the other intervals.

Accordingly, when an elimination operation is performed on the two BOC(1,1) partial correlation functions in $P_0^\alpha(\tau)$ and $P_1^\alpha(\tau)$, as shown in Equation 6, a predetermined positive value is obtained only in the interval $-T_c/A<\tau<T_c/A$, and 0 is obtained in the other intervals.

$$S_0^\alpha(\tau)=|P_0^\alpha(\tau)|+|P_1^\alpha(\tau)|-|P_0^\alpha(\tau)-P_1^\alpha(\tau)| \quad (6)$$

More specifically, the BOC(1,1) sub-correlation function $S_0^\alpha(\tau)$ has a main peak $2P_1^\alpha(\tau)$ in the interval $-T_c/4<\tau<0$, has a main peak $2P_0^\alpha(\tau)$ in the interval $0<\tau<T_c/4$, is 0 in the other intervals, and thus has no side peaks.

Figure 6:
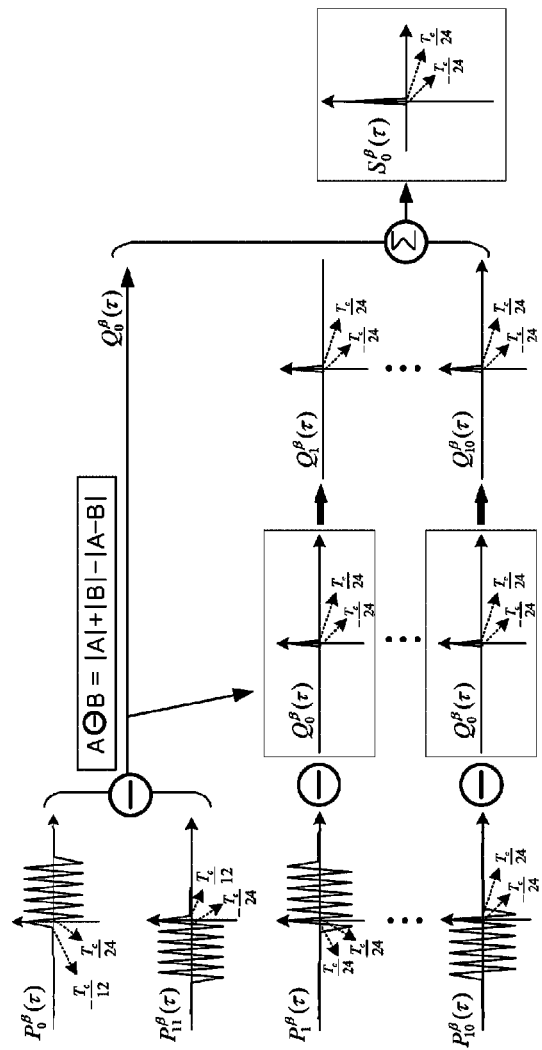
FIG. 6 illustrates matched pairs of partial correlation functions, constituting the auto-correlation function of the BOC(6,1) components of a TMBOC(6,1,4/33) received signal for the apparatus for tracking a TMBOC signal according to the present embodiment, and a BOC(6,1) sub-correlation function.

Next, referring to FIG. 6 to illustrate the process of obtaining a BOC(6,1) sub-correlation function that is used to reach a main correlation function based on BOC(6,1) partial correlation functions, FIG. 6 illustrates matched pairs of partial correlation functions, constituting the auto-correlation function of the BOC(6,1) components of a TMBOC(6,1,4/33) received signal for the apparatus for tracking a TMBOC signal according to the present embodiment, and a BOC(6,1) sub-correlation function.

In FIG. 6, a first intermediate correlation function) $Q_0^\beta(\tau)$ is generated by performing an elimination operation on a first (y=0) and last (y=11) partial correlation function pair $P_0^\beta(\tau)$ and $P_{11}^\beta(\tau)$ with respect to 12 BOC(6,1) partial correlation functions $\{P_y^\beta(\tau)\}_{y=0}^{11}$, as shown in the following Equation 7:

$$Q_0^\alpha(\tau)=|P_0^\beta(\tau)|+|P_{11}^\beta(\tau)|-|P_0^\beta(\tau)-P_{11}^\beta(\tau)| \quad (7)$$

The first BOC(6,1) partial correlation function 17, $P_0^\beta(\tau)$ has a zero-crossing closest to an origin at $T_c/24$, and the eleventh BOC(1,1) partial correlation function $P_{11}^\beta(\tau)$ has a zero-crossing closest to the origin at $-T_c/24$. It can be observed that the product $P_0^\beta(\tau)P_{11}^\beta(\tau)$ of the two BOC(1,1) partial correlation functions has a positive value only in the interval $-T_c/24<\tau<T_c/24$, and has 0 or a negative value in the other intervals.

Accordingly, when an elimination operation is performed on the two BOC(6,1) partial correlation functions 17, $P_0^\beta(\tau)$ and $P_{11}^\beta(\tau)$, as shown in Equation 7, a predetermined positive value is obtained only in the interval $-T_c/24<\tau<T_c/24$, and 0 is obtained in the other intervals.

Accordingly, the first intermediate correlation function $Q_0^\beta(\tau)$ has a main peak $2P_0^\beta(\tau)$ in the interval $-T_c/24<\tau<0$, has a main peak $2P_{11}^\beta(\tau)$ in the interval $0<\tau<T_c/24$, is 0 in the other intervals, and thus has no side peaks.

Although this first intermediate correlation function $Q_0^\beta(\tau)$ has a sharp main peak, it is not desirable to generate a final main correlation function using only the first intermediate correlation function $Q_0^\beta(\tau)$ with the information of the other partial correlation functions lost because BOC(6,1) signal components are merely 4/33 of all pilot signal components and the first intermediate correlation function $Q_0^\beta(\tau)$ is calculated using only information about the correlation functions of the two pulses of the 12 pulses of the BOC(6,1) signal components.

However, with respect to the remaining second to eleventh partial correlation functions $\{P_y^\beta(\tau)\}_{y=1}^{10}$, side peaks cannot be completely eliminated by performing an elimination operation between partial correlation functions.

Accordingly, in accordance with the present invention, in order to eliminate side peaks from the second to eleventh partial correlation functions and maximally obtain only information, which a peak at an origin has, from each of the partial correlation functions, second to eleventh intermediate correlation functions $\{Q_n^\beta(\tau)\}_{n=1}^{10}$, are obtained by performing an elimination operation on the second to eleventh partial correlation functions $\{P_y^\beta(\tau)\}_{y=1}^{10}$ and the first intermediate correlation function $Q_0^\beta(\tau)$, as shown in the following Equation 8:

$$Q_n^\alpha(\tau) = |Q_0^\beta(\tau)| + |P_{y=n}^\beta(\tau)| - |Q_0^\beta(\tau) - P_{y=n}^\beta(\tau)| \quad (8)$$

where n ranges from 1 to 10.

The BOC(6,1) sub-correlation function $S_0^\beta(\tau)$ may be obtained by summing the first to eleventh intermediate correlation functions $\{Q_n^\beta(\tau)\}_{n=0}^{10}$, as shown in the following Equation 9:

$$S_0^\beta(\tau) = \sum_{n=0}^{10} Q_n^\beta(\tau) \quad (9)$$

Finally, the main correlation function $R_{proposed}(\tau)$ proposed by the present invention is obtained by summing the BOC(1,1) sub-correlation function $S_0^\alpha(\tau)$ and the BOC(6,1) sub-correlation function $S_0^\beta(\tau)$, as shown in the following Equation 10:

$$R_{proposed}(\tau) = S_0^\alpha(\tau) + S_0^\beta(\tau) \quad (10)$$

Figure 7:
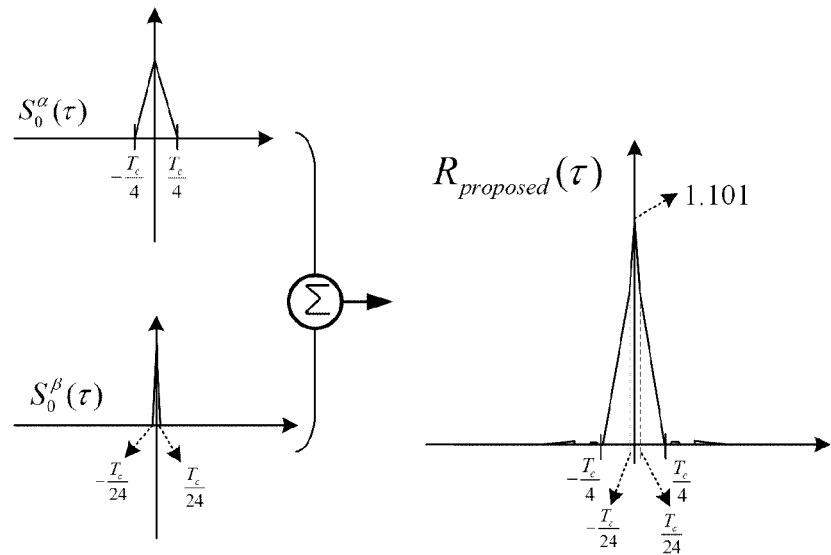
FIG. 7 illustrates a main correlation function that is generated by summing the BOC(1,1) sub-correlation function and BOC(6,1) sub-correlation function of a TMBOC(6,1,4/33) received signal for the apparatus for tracking a TMBOC signal according to the present embodiment.

Referring to FIG. 7 to schematically describe the generation of the main correlation function $R_{proposed}(\tau)$, FIG. 7 illustrates a main correlation function that is generated by summing the BOC(1,1) sub-correlation function and BOC(6,1) sub-correlation function of a TMBOC(6,1,4/33) received signal for the apparatus for tracking a TMBOC signal according to the present embodiment.

In FIG. 7, the width of the base of the main peak of the BOC(1,1) sub-correlation function $S_0^\alpha(\tau)$ is $T_c/2$, and the width of the base of the main peak of the BOC(6,1) sub-correlation function $S_0^\beta(\tau)$ is $T_c/24$.

Accordingly, the main peak of the main correlation function $R_{proposed}(\tau)$ obtained by summing the BOC(1,1) sub-correlation function $S_0^\alpha(\tau)$ and the BOC(6,1) sub-correlation function $S_0^\beta(\tau)$ exhibits a shape the width of the base of which is $T_c/2$ and which becomes sharper in the interval $-T_c/24 < \tau < T_c/24$.

Figure 8:
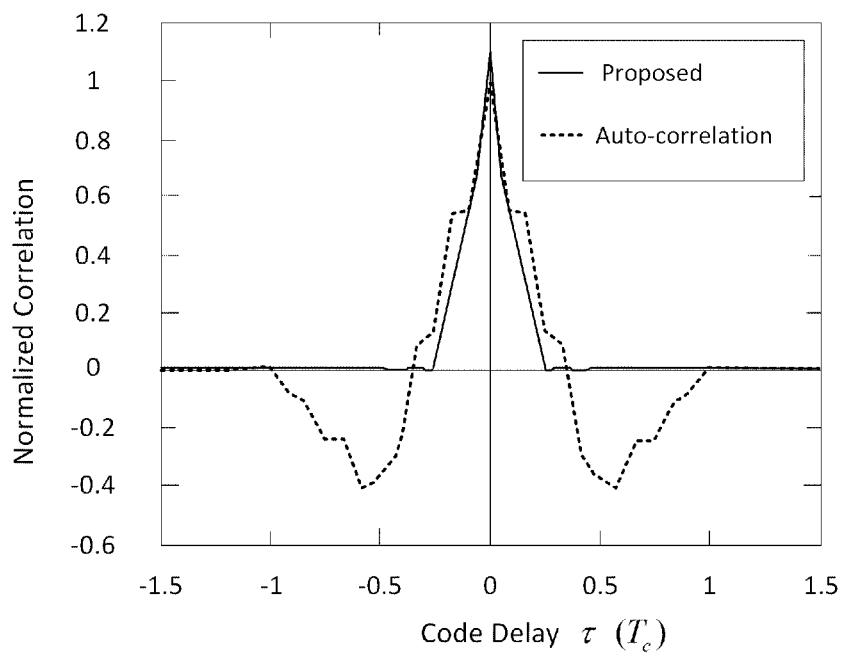
FIG. 8 is a graph illustrating the comparison between a main correlation function and an auto-correlation function that are generated as illustrated in FIG. 7 with respect to a TMBOC(6,1,4/33) received signal for the apparatus for tracking a TMBOC signal according to the present embodiment.

Referring to FIG. 8 to describe the shape and relative advantage of the main correlation function $R_{proposed}(\tau)$, FIG. 8 is a graph illustrating the comparison between a main correlation function and an auto-correlation function that are generated as illustrated in FIG. 7 with respect to a TMBOC (6,1,4/33) received signal for the apparatus for tracking a TMBOC signal according to the present embodiment.

In FIG. 8, in the case of the auto-correlation function of the TMBOC(6,1,4/33) signal, side peaks are not prominent, but the slope of a main peak is not constant and considerably changes.

In contrast, in the case of the main correlation function $R_{proposed}(\tau)$ proposed by the present invention, basically all side peaks have been eliminated, the height of a main peak is increased to approximately 1.1, and particularly the slope of the main peak has become sharper near an origin, thereby improving track performance.

Referring back to FIG. 3, the DLL 24 using such a main correlation function is described in greater detail.

In general, the DLL 24 determines whether two correlation values based on an early delay value preceding a desired delay value and a late delay value following the desired delay value have passed the apex of a main peak while driving a loop while gradually changing the delay values based on the two correlation values to which the early delay value and the late delay value have been applied.

In greater detail, for example, when a code delay value is gradually changed from −1 chip to +1 chip, an early correlation value based on an early delayed signal having an early delay value larger than a current delay value reaches the left slope of a main peak and passes the apex of the main peak earlier than a late correlation value based a late delayed signal having a late delay value smaller than the current delay value.

If the difference between the early correlation value and the late correlation value is tracked, the difference will continue to have a positive value, will gradually decrease from the point where the early correlation value passes the apex of the main peak when the early correlation value is located on the left slope of the main peak, will become 0 when the early correlation value and the late correlation value are symmetrical with respect to the apex, and will have a negative value when the early correlation value further proceed to the right slope of the main peak.

Through this observation, it may be said that the prompt correlation value reaches the apex at a point where the difference between the early correlation value and the late correlation value passes 0, that is, a zero-crossing point.

A discrimination function capable of discriminating the state of a prompt correlation value, such as the difference between the early correlation value and the late correlation value, is generally referred to as a discriminator. Although a discrimination function for a discriminator may be devised in various manners, a discrimination function D(t), such as that of the following Equation 11, may be used:

$$D(\tau) = R_{proposed}^2\left(\tau + \frac{\Delta}{2}\right) - R_{proposed}^2\left(\tau - \frac{\Delta}{2}\right) \quad (11)$$

where Δ is the difference between the early and late delay values.

That is, if a change in a value obtained by subtracting the square of the result of the late main correlation function from the square of the result of the early main correlation function is tracked using such a discrimination function and then zero crossing is detected, it may be determined that the main correlation function has reached the apex of the main peak at the delay value.

Next, the operation of the DLL 24 is described based on the discussion so far set forth.

First, the local signal generation unit 31 generates an early and late delayed signal pair m(t+τ+Δ/2) and m(t+τ−Δ/2), early and late delayed, respectively, based on phase delay τ and a delay value difference Δ provided by the NCO 39, with respect to the signal pulse train of a TMBOC(6,1,4/33)-modulated received signal m(t), and then provides them to the early and late mixers 32a and 32b, respectively.

The early and late mixers 32a and 32b output an early and late mixed signal pairs, obtained by multiplying the received signal m(t) by the early and late delayed received signal pair m(t+τ+Δ/2) and m(t+τ−Δ/2), to the early and late correlation units 33a and 33b, respectively.

The early and late correlation units 33a and 33b generate early BOC(1,1) partial correlation functions $\{P_x^\alpha(\tau+\Delta/2)\}_{x=0}^1$ and early BOC(6,1) partial correlation functions $\{P_y^\beta(\tau+\Delta/2)\}_{y=0}^{11}$, and late BOC(1,1) partial correlation functions $\{P_x^\alpha(\tau+\Delta/2)\}_{x=0}^1$ and late BOC(6,1) partial correlation functions $\{P_y^\beta(\tau-\Delta/2)\}_{y=0}^{11}$ by performing an auto-correlation operation on the early and late mixed signal pairs m(t+τ+Δ/2) and m(t+τ−Δ/2), as shown in Equation 4, with respect to the total time T(0≤t≤T).

The early BOC(1,1) sub-correlation unit 34a generates an early BOC(1,1) sub-correlation function $S_0^\alpha(\tau+\Delta/2)$ by performing an elimination operation on the two early BOC(1,1) partial correlation functions $\{P_x^\alpha(\tau+\Delta/2)\}_{x=0}^1$, as shown in Equation 6.

Similarly, the late BOC(1,1) sub-correlation unit 34b generates a late BOC(1,1) sub-correlation function $S_0^\alpha(\tau-\Delta/2)$ by performing an elimination operation on the two late BOC(1,1) partial correlation functions $\{P_x^\alpha(\tau-\Delta/2)\}_{x=0}^1$, as shown in Equation 6.

The early BOC(6,1) sub-correlation unit 35a obtains a first early intermediate correlation function $Q_0^\beta(\tau+\Delta/2)$ by performing an elimination operation on the first and twelfth early BOC(6,1) partial correlation functions $P_0^\beta(\tau+\Delta/2)$ and $P_{11}^\beta(\tau+\Delta/2)$ of the 12 early BOC(6,1) partial correlation functions $\{P_y^\beta(\tau+\Delta/2)\}_{y=0}^{11}$, as shown in Equation 7, generates second to eleventh early intermediate correlation functions $\{Q_n^\beta(\tau+\Delta/2)\}_{n=1}^{10}$ by performing an elimination operation on the second to eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, as shown in Equation 8, and generates the early BOC(6,1) sub-correlation function $S_0^\beta(\tau+\Delta/2)$ by summing all the first to eleventh early intermediate correlation functions $\{Q_n^\beta(\tau+\Delta/2)\}_{n=0}^{10}$.

Similarly, the late BOC(6,1) sub-correlation unit 35b obtains a first late intermediate correlation function $Q_0^\beta(\tau-\Delta/2)$ by performing an elimination operation on the first and twelfth late BOC(6,1) partial correlation functions $P_0^\beta(\tau-\Delta/2)$ and $P_{11}^\beta(\tau-\Delta/2)$ of the 12 late BOC(6,1) partial correlation functions $\{P_y^\beta(\tau-\Delta/2)\}_{y=0}^{11}$, as shown in Equation 7, generates second to eleventh late intermediate correlation functions $\{Q_n^\beta(\tau-\Delta/2)\}_{n=1}^{10}$ by performing an elimination operation on the second to eleventh late BOC(6,1) partial correlation functions $\{P_y^\beta(\tau-\Delta/2)\}_{y=1}^{10}$ and the first late intermediate correlation function $Q_0^\beta(\tau-\Delta/2)$, as shown in Equation 8, and generates a late BOC(6,1) sub-correlation function $S_0^\beta(\tau-\Delta/2)$ by summing all the first to eleventh late intermediate correlation functions $\{Q_n^\beta(\tau-\Delta/2)\}_{n=0}^{10}$.

The early combination unit 36a may generate an early main correlation function $R_{proposed}(\tau+\Delta/2)$ by summing the early BOC(1,1) sub-correlation function $S_0^\alpha(\tau+\Delta/2)$ and the early BOC(6,1) sub-correlation function $S_0^\beta(\tau+\Delta/2)$, and the late combination unit 36b may generate a late main correlation function $R_{proposed}(\tau-\Delta/2)$ by summing the late BOC(1,1) sub-correlation function $S_0^\alpha(\tau-\Delta/2)$ and the late BOC(6,1) sub-correlation function $S_0^\beta(\tau-\Delta/2)$.

The main peaks of the early and late main correlation functions $R_{proposed}(\tau+\Delta/2)$ and $R_{proposed}(\tau-\Delta/2)$ exhibit a shape the height of which is approximately 1.10, the width of the base of which is $T_c/2$, and which becomes sharper within the interval $\pm T_c/24$ at the center of the main peak.

The discriminator mixer 37 outputs an output value by obtained by subtracting the square of the late main correlation function $R_{proposed}(\tau-\Delta/2)$ from the square of the early main correlation function $R_{proposed}(\tau+\Delta/2)$ in accordance with a predetermined discrimination function, for example, Equation 11.

The loop filter 38 may filter out the noise component of the discrimination output of the discriminator mixer 37.

The NCO 39 determines the phase delay τ of the delayed signal for the received signal based on the filtered discrimination output, and outputs the determined phase delay τ to the local signal generation unit 31.

For example, the NCO 39 may increase the phase delay τ by a predetermined interval and then output the increased phase delay τ to the local signal generation unit 31, on the ground that if the discrimination output is a positive value larger than a predetermined threshold value, this means that an early correlation value is larger than a late correlation value and also means that the applied phase delay τ is smaller than a phase delay corresponding to the apex of a main peak in light of the shape of the main peak of a main correlation function.

Furthermore, if it is determined that the main correlation function value based on the phase delay τ is located at the apex of the main peak based on the filtered discrimination output, the NCO 39 outputs the value of the phase delay τ at the time to the local code generation unit 22 as a code delay value.

Figure 9:
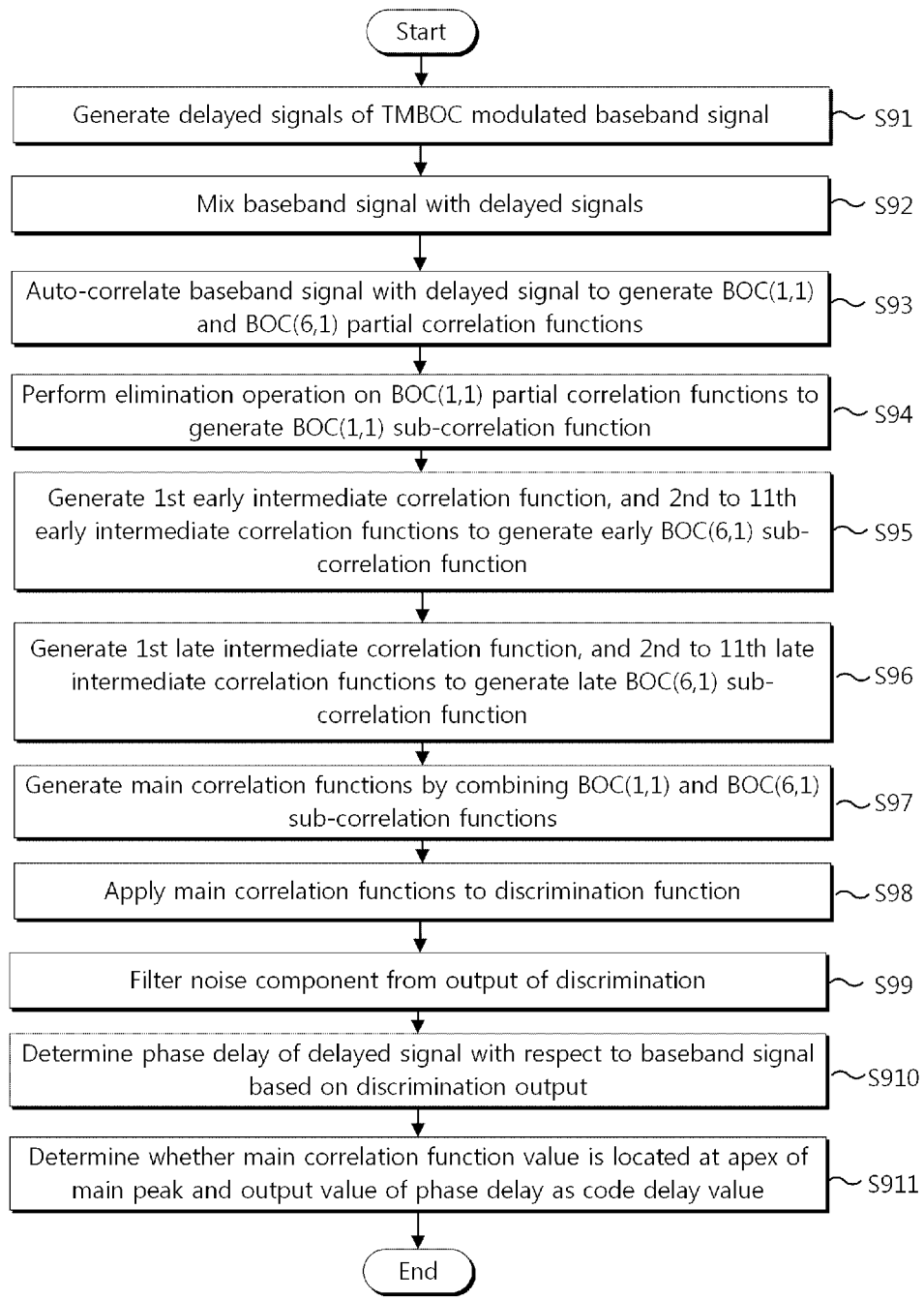
FIG. 9 is a flowchart illustrating a method of tracking a TMBOC signal according to another embodiment of the present invention.

FIG. 9 is a flowchart illustrating a method of tracking a TMBOC signal according to another embodiment of the present invention.

At step S91, an early and late delayed signal pair m(t+τ+Δ/2) and m(t+τ−Δ/2) early delayed and late delayed, respectively, is generated based on a phase delay τ and a delay value difference Δ provided by the NCO 39, with respect to the signal pulse train of a TMBOC(6,1,4/33)-modulated received signal m(t).

At step S92, early and late mixed signal pairs obtained by multiplying the received signal m(t) by the early and late delayed received signal pair m(t+τ+Δ/2) and m(t+τ−Δ/2) are output.

At step S93, early BOC(1,1) partial correlation functions $\{P_x^\alpha(\tau+\Delta/2)\}_{x=0}^1$ and early BOC(6,1) partial correlation functions $\{P_y^\beta(\tau+\Delta/2)\}_{y=0}^{11}$, and late BOC(1,1) partial correlation functions $\{P_x^\alpha(\tau-\Delta/2)\}_{x=0}^1$ and late BOC(6,1) partial correlation functions $\{P_y^\beta(\tau-\Delta/2)\}_{y=0}^{11}$ are generated by performing an auto-correlation operation on the early and late mixed signal pairs, as shown in Equation 4, with respect to the total time T(0≤t≤T).

At step S94, an early BOC(1,1) sub-correlation function $S_0^\alpha(\tau+\Delta/2)$ is generated by performing an elimination operation on the two early BOC(1,1) partial correlation functions $\{P_x^\alpha(\tau+\Delta/2)\}_{x=0}^1$, as shown in Equation 6, and a late BOC(1,1) sub-correlation function $S_0^\alpha(\tau-\Delta/2)$ is generated by performing an elimination operation on the two late BOC(1,1) partial correlation functions $\{P_x^\alpha(\tau-\Delta/2)\}_{x=0}^1$, as shown in Equation 6.

Thereafter, at step S95, a first early intermediate correlation function $Q_0^\beta(\tau+\Delta/2)$ is obtained by performing an elimination operation on the first and twelfth early BOC(6,1) partial correlation functions $P_0^\beta(\tau+\Delta/2)$ and $P_{11}^\beta(\tau+\Delta/2)$ of the 12 early BOC(6,1) partial correlation functions $\{P_y^\beta(\tau+\Delta/2)\}_{y=0}^{11}$, as shown in Equation 7, second to eleventh early intermediate correlation functions $\{Q_n^\beta(\tau+\Delta/2)\}_{n=1}^{10}$ are obtained by performing an elimination operation on the second to eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, as shown in Equation 8, and the early BOC(6,1) sub-correlation function $S_0^\beta(\tau+\Delta/2)$ is generated by summing all the first to eleventh early intermediate correlation functions $\{Q_n^\beta(\tau+\Delta/2)\}_{n=0}^{10}$.

Furthermore, at step S96, a first late intermediate correlation function $Q_0^\beta(\tau-\Delta/2)$ is obtained by performing an elimination operation on the first and twelfth late BOC(6,1) partial correlation functions $P_0^\beta(\tau-\Delta/2)$ and $P_{11}^\beta(\tau-\Delta/2)$ of the 12 late BOC(6,1) partial correlation functions $\{P_y^\beta(\tau-\Delta/2)\}_{y=0}^{11}$, as shown in Equation 7, second to eleventh late intermediate correlation functions $\{Q_n^\beta(\tau-\Delta/2)\}_{n=1}^{10}$ are obtained by performing an elimination operation on the second to eleventh late BOC(6,1) partial correlation functions $\{P_y^\beta(\tau-\Delta/2)\}_{y=1}^{10}$ and the first late intermediate correlation function $Q_0^\beta(\tau-\Delta/2)$, as shown in Equation 8, and a late BOC(6,1) sub-correlation function $S_0^\beta(\tau-\Delta/2)$ is generated by summing all the first to eleventh late intermediate correlation functions $\{Q_n^\beta(\tau-\Delta/2)\}_{n=0}^{10}$.

At step S97, an early main correlation function $R_{proposed}(\tau+\Delta/2)$ is generated by summing the early BOC(1,1) sub-correlation function $S_0^\alpha(\tau+\Delta/2)$ and the early BOC(6,1) sub-correlation function $S_0^\beta(\tau+\Delta/2)$, and a late main correlation function $R_{proposed}(\tau-\Delta/2)$ is generated by summing the late BOC(1,1) sub-correlation function $S_0^\alpha(\tau-\Delta/2)$ and the late BOC(6,1) sub-correlation function $S_0^\beta(\tau-\Delta/2)$.

The main peaks of the early and late main correlation functions $R_{proposed}(\tau+\Delta/2)$ and $R_{proposed}(\tau-\Delta/2)$ exhibit a shape the height of which is approximately 1.10, the width of the base of which is $T_c/2$, and which becomes sharper within the interval $\pm T_c/24$ at the center of the main peaks.

At step S98, a discrimination output value obtained by subtracting the square of the late main correlation function $R_{proposed}(\tau-\Delta/2)$ from the square of the early main correlation function $R_{proposed}(\tau+\Delta/2)$ in accordance with a predetermined discrimination function, for example, Equation 11, is output.

At step S99, the noise component of the discrimination output may be filtered out.

At step S910, the phase delay $\tau$ of the delayed signal for the received signal may be determined based on the filtered discrimination output.

Furthermore, at step S911, if it is determined that the main correlation function value based on the phase delay $\tau$ is located at the apex of a main peak based on the filtered discrimination output, the value of the phase delay $\tau$ at the time is output as a code delay value.

Figure 10:
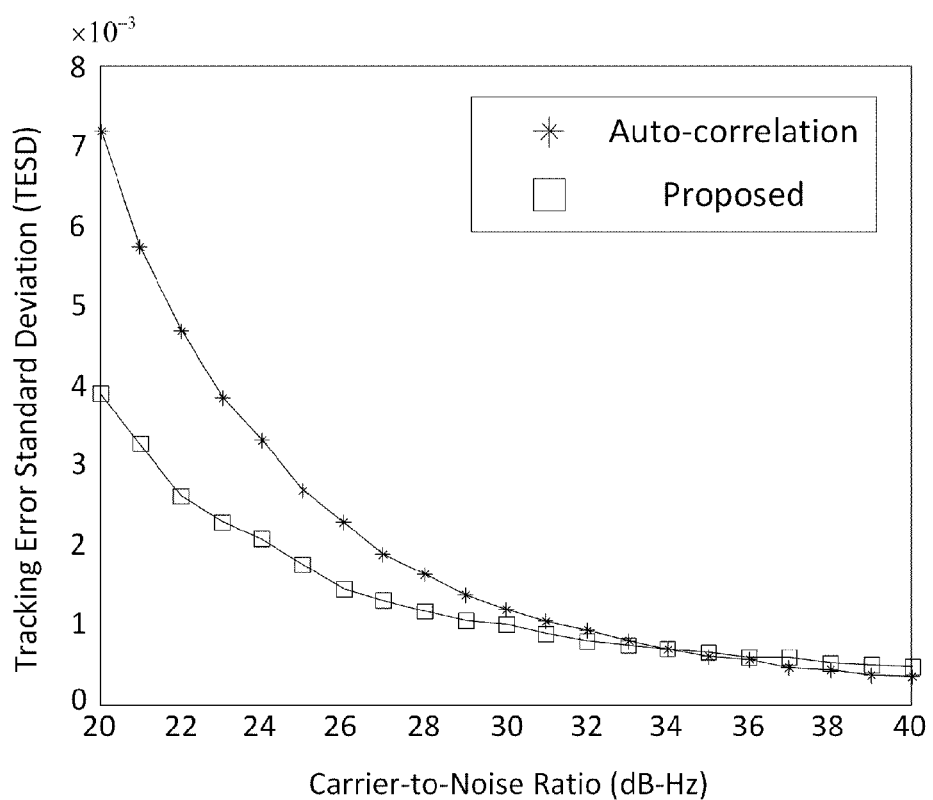
FIG. 10 is a graph illustrating the performance of the apparatus and method for tracking a TMBOC signal according to the embodiments of the present invention.

FIG. 10 is a graph illustrating the performance of the apparatus and method for tracking a TMBOC signal according to the embodiments of the present invention.

Performance index is tracking error standard deviation (TESD). The TESD of the auto-correlation function of a TMBOC(6,1,4/33) signal and TESD using a main correlation function according to the present invention were simulated within a predetermined carrier to noise ratio (CNR) range.

It can be seen that, when the TESDs were observed while the CNR was being varied, the case of performing tracking using a main correlation function according to the present invention exhibited lower TESDs than the case of performing tracking using an auto-correlation function at CNRs in all ranges of interest, and thus the case of performing tracking using a main correlation function according to the present invention exhibited excellent performance indices than the case of performing tracking using an auto-correlation function.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

Furthermore, the apparatus according to the present invention may be implemented as computer-readable code stored on a computer-readable storage medium. The computer-readable storage medium includes all types of storage devices on which data that can be read by a computer system can be stored. Examples of the storage medium include ROM, RAM, an optical disk, magnetic tape, a floppy disk, hard disk, nonvolatile memory. Furthermore, the computer-readable medium may be distributed across a computer system connected over a network, and thus computer-readable code may be stored and executed in a distributed manner.

What is claimed is:

1. A delay lock loop (DLL), comprising:
a local signal generation unit configured to generate an early and late delayed signal pair $m(t+\tau+\Delta/2)$ and $m(t+\tau-\Delta/2)$ with respect to a total time $0<t<T$, T being a real number, early and late delayed, respectively, based on a phase delay $\tau$ and a delay value difference $\Delta$, wherein $\tau$ and $\Delta$ are real numbers, with respect to a signal pulse train of a time-multiplexed binary offset carrier (TM-BOC)(6,1,4/33)-modulated received signal m(t);
early and late correlation units configured to generate early binary offset carrier (BOC)(1,1) partial correlation functions $\{P_x^\alpha(\tau+\Delta/2)\}_{x=0}^1$ and early BOC(6,1) partial correlation functions $\{P_y^\beta(\tau+\Delta/2)\}_{y=0}^{11}$, and late BOC(1,1) partial correlation functions $\{P_x^\alpha(\tau-\Delta/2)\}_{x=0}^1$ and late BOC(6,1) partial correlation functions $\{P_y^\beta(\tau-\Delta/2)\}_{y=0}^{11}$ by performing an auto-correlation operation on the early and late mixed signal pairs $m(t+\tau+\Delta/2)$ and $m(t+\tau-\Delta/2)$ with respect to a total time $T(0 \leq t \leq T)$, wherein x, y, $\alpha$, $\beta$ are integers;
early and late BOC(1,1) sub-correlation units configured to generate early and late BOC(1,1) sub-correlation functions $S_0^\alpha(\tau+\Delta/2)$ and $S_0^\alpha(\tau-\Delta/2)$ by performing an elimination operation on the early BOC(1,1) partial correlation functions $\{P_x^\alpha(\tau+\Delta/2)\}_{x=0}^1$ and $\{P_x^\alpha(\tau-\Delta/2)\}_{x=0}^1$;
an early BOC(6,1) sub-correlation unit configured to obtain a first early intermediate correlation function $Q_0^\beta(\tau+\Delta/2)$ by performing an elimination operation on a first and a twelfth early BOC(6,1) partial correlation functions $P_0^\beta(\tau+\Delta/2)$ and $P_{11}^\beta(\tau+\Delta/2)$ of 12 early BOC(6,1) partial correlation functions $\{P_y^\beta(\tau+\Delta/2)\}_{y=0}^{11}$, to obtain a second early intermediate correlation function through and including an eleventh early intermediate correlation function $\{Q_n^\beta(\tau+\Delta/2)\}_{n=1}^{10}$ by performing an elimination operation on second through and including eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, and to generate an early BOC(6,1) sub-correlation function $S_0^\beta(\tau+\Delta/2)$ by summing all the first through and including an eleventh early intermediate correlation functions $\{Q_n^\beta(\tau+\Delta/2)\}_{n=0}^{10}$;
a late BOC(6,1) sub-correlation unit configured to obtain a first late intermediate correlation function $Q_0^\beta(\tau-\Delta/2)$ by performing an elimination operation on a first and a twelfth late BOC(6,1) partial correlation functions $P_0^\beta(\tau-\Delta/2)$ and $P_{11}^\beta(\tau-\Delta/2)$ of 12 late BOC(6,1) partial correlation functions $\{P_y^\beta(\tau-\Delta/2)\}_{y=0}^{11}$, to obtain a second late intermediate correlation function through and including an eleventh late intermediate correlation function $\{Q_n^\beta(\tau-\Delta/2)\}_{n=1}^{10}$ by performing an elimination operation on a second through and including an eleventh late BOC(6,1) partial correlation functions $\{P_y^\beta(\tau-$ $\Delta/2)\}_{y=1}^{10}$ and the first late intermediate correlation function $Q_0^\beta(\tau-\Delta/2)$, and to generate a late BOC(6,1) sub-correlation function $S_0^\beta(\tau-\Delta/2)$ by summing all the first through and including the eleventh late intermediate correlation functions $\{Q_n^\beta(\tau-\Delta/2)\}_{n=0}^{10}$;

early and late combination units configured to generate an early main correlation function $R_{proposed}(\tau+\Delta/2)$ by summing the early BOC(1,1) sub-correlation function $S_0^\alpha(\tau+\Delta/2)$ and the early BOC(6,1) sub-correlation function $S_0^\beta(\tau+\Delta/2)$, and to generate a late main correlation function $R_{proposed}(\tau-\Delta/2)$ by summing the late BOC(1,1) sub-correlation function $S_0^\alpha(\tau-\Delta/2)$ and the late BOC(6,1) sub-correlation function $S_0^\beta(\tau-\Delta/2)$; and a numerical control oscillator (NCO) configured to determine a phase delay $\tau$ for the TMBOC(6,1,4/33)-modulated received signal m(t) based on a discrimination output of a discrimination function based on values of the early and late main correlation functions, and to output the determined phase delay $\tau$ to the local signal generation unit;

wherein the elimination operation is an operation satisfying algebraic relations in which $|A|+|B|-|A-B|=0$ when real numbers A and B are $AB\leq0$ and $|A|+|B|-|A-B|>0$ when the real numbers A and B are $AB>0$.

2. The DLL of claim 1, wherein the early BOC(1,1) partial correlation functions $\{P_x^\alpha(\tau+\Delta/2)\}_{x=0}^{1}$ and the early BOC(6,1) partial correlation functions $\{P_y^\beta(\tau+\Delta/2)\}_{y=0}^{11}$, and the late BOC(1,1) partial correlation functions $\{P_x^\alpha(\tau-\Delta/2)\}_{x=0}^{1}$ and the late BOC(6,1) partial correlation functions $\{P_y^\beta(\tau-\Delta/2)\}_{y=0}^{11}$ are based on a following equation:

$$R(\tau) = \frac{1}{PT}\int_0^T m(t)m(t+\tau)dt$$

$$= \sum_{x=0}^{1}\sum_{i=-\infty}^{\infty}\frac{1}{T\sqrt{P}}\int_0^T m(t)h_i r_{T_c}(t+\tau-iT_c)p_x^\alpha(t+\tau)dt +$$

$$\sum_{y=0}^{11}\sum_{i=-\infty}^{\infty}\frac{1}{T\sqrt{P}}\int_0^T m(t)h_i r_{T_c}(t+\tau-iT_c)p_y^\beta(t+\tau)dt$$

$$= \sum_{x=0}^{1}p_x^\alpha(\tau) + \sum_{y=0}^{11}p_y^\beta(\tau)$$

where P is power of the TMBOC modulated signal, $h_i\in\{-1,1\}$ is an i-th chip of a PRN code having a period T, i being an integer, $T_c$ is a chip period of the PRN code, $r_{T_c}(t)$ is a unit square wave present in $[0, T_c]$, and $p_x^\alpha(t)$ and $p_x^\beta(t)$ are two BOC(1,1) partial sub-carrier components $p_x^\alpha(t)$ and 12 BOC(6,1) partial sub-carrier components $p_x^\beta(t)$ of the TMBOC(6,1,4/33)-modulated received signal m(t).

3. The DLL of claim 1, wherein the early BOC(1,1) sub-correlation function $S_0^\alpha(\tau+\Delta/2)$ or the late BOC(1,1) sub-correlation function $S_0^\alpha(\tau-\Delta/2)$ is generated based on a following equation:

$S_0^\alpha(\tau)=|P_0^\alpha(\tau)|+|P_1^\alpha(\tau)|-|P_0^\alpha(\tau)-P_1^\alpha(\tau)|.$ 4. The DLL of claim 3, wherein:

the first early intermediate correlation function $Q_0^\beta(\tau+\Delta/2)$ and the first late intermediate correlation function $Q_0^\beta(\tau-\Delta/2)$ are generated based on a following Equation:

$Q_0^\alpha(\tau)=|P_0^\beta(\tau)|+|P_{11}^\beta(\tau)|-|P_0^\beta(\tau)-P_{11}^\beta(\tau)|;$ the second through and including eleventh early intermediate functions and the second through and including eleventh late intermediate correlation functions $\{Q_n^\beta(\tau+\Delta/2)\}_{n=1}^{10}$ and the second through and including eleventh late intermediate correlation functions $\{Q_n^\beta(\tau-\Delta/2)\}_{n=1}^{10}$ are generated based on a following Equation:

$Q_n^\alpha(\tau)=|Q_0^\beta(\tau)|+|P_{y=n}^\beta(\tau)|-|Q_0^\beta(\tau)-P_{y=n}^\beta(\tau)|;$ and the early BOC(6,1) sub-correlation function $S_0^\beta(\tau+\Delta/2)$ and the late BOC(6,1) sub-correlation function $S_0^\beta(\tau-\Delta/2)$ are generated based on a following equation:

$$S_0^\beta(\tau) = \sum_{n=0}^{10} Q_n^\beta(\tau).$$

5. The DLL of claim 1, wherein the discrimination function is defined by a following equation:

$$D(\tau) = R_{proposed}^2\left(\tau+\frac{\Delta}{2}\right) - R_{proposed}^2\left(\tau-\frac{\Delta}{2}\right).$$

6. A method of tracking a time-multiplexed binary offset carrier (TMBOC)(6,1,4/33) signal, comprising:

generating an early and late delayed signal pair $m(t+\tau+\Delta/2)$ and $m(t+\tau-\Delta/2)$ with respect to a total time $0\leq t\leq T$, T being a real number, early and late delayed, respectively, based on a phase delay $\tau$ and a delay value difference $\Delta$, wherein $\tau$ and $\Delta$ are real numbers, with respect to a signal pulse train of a TMBOC(6,1,4/33)-modulated received signal m(t);

generating early binary offset carrier (BOC)(1,1) partial correlation functions $\{P_x^\alpha(\tau+\Delta/2)\}_{x=0}^{1}$ and early BOC(6,1) partial correlation functions $\{P_y^\beta(\tau+\Delta/2)\}_{y=0}^{11}$, and late BOC(1,1) partial correlation functions $\{P_x^\alpha(\tau-\Delta/2)\}_{x=0}^{1}$ and late BOC(6,1) partial correlation functions $\{P_y^\beta(\tau-\Delta/2)\}_{y=0}^{11}$ by performing an auto-correlation operation on the early and late mixed signal pairs $m(t+\tau+\Delta/2)$ and $m(t+\tau-\Delta/2)$ with respect to a total time $T(0\leq t\leq T)$, wherein x, y, $\alpha$, $\beta$ are integers;

generating early and late BOC(1,1) sub-correlation functions $S_0^\alpha(\tau+\Delta/2)$ and $S_0^\alpha(\tau-\Delta/2)$ by performing an elimination operation on the early BOC(1,1) partial correlation functions $\{P_x^\alpha(\tau+\Delta/2)\}_{x=0}^{1}$ and $\{P_x^\alpha(\tau-\Delta/2)\}_{x=0}^{1}$;

obtaining a first early intermediate correlation function $Q_0^\beta(\tau+\Delta/2)$ by performing an elimination operation on a first and a twelfth early BOC(6,1) partial correlation functions $P_0^\beta(\tau+\Delta/2)$ and $P_{11}^\beta(\tau+\Delta/2)$ of 12 early BOC(6,1) partial correlation functions $\{P_y^\beta(\tau+\Delta/2)\}_{y=0}^{11}$, obtaining a second early intermediate correlation function through and including an eleventh early intermediate correlation functions $\{Q_n^\beta(\tau+\Delta/2)\}_{n=1}^{10}$ by performing an elimination operation on a second through and including an eleventh early BOC(6,1) partial correlation functions $\{P_y^\beta(\tau+\Delta/2)\}_{y=1}^{10}$ and the first early intermediate correlation function $Q_0^\beta(\tau+\Delta/2)$, and generating the early BOC(6,1) sub-correlation function $S_0^\beta(\tau+\Delta/2)$ by summing all the first through and including eleventh early intermediate correlation functions $\{Q_n^\beta(\tau+\Delta/2)\}_{n=0}^{10}$;

obtaining a first late intermediate correlation function $Q_0^\beta(\tau-\Delta/2)$ by performing an elimination operation on a first and a twelfth late BOC(6,1) partial correlation functions $P_0^\beta(\tau-\Delta/2)$ and $P_{11}^\beta(\tau-\Delta/2)$ of 12 late BOC(6,1) partial correlation functions $\{P_y^\beta(\tau-\Delta/2)\}_{y=0}^{11}$, obtaining a second late intermediate correlation function through and including an eleventh late intermediate correlation functions $\{Q_n^\beta(\tau-\Delta/2)\}_{n=1}^{10}$ by performing an elimination operation on a second through and including an eleventh late BOC(6,1) partial correlation functions $\{P_y^\beta(\tau-\Delta/2)\}_{y=1}^{10}$ and the first late intermediate correlation function $Q_0^\beta(\tau-\Delta/2)$, and generating a late BOC(6,1) sub-correlation function $S_0^\beta(\tau-\Delta/2)$ by summing all the first-through and including eleventh late intermediate correlation functions $\{Q_n^\beta(\tau-\Delta/2)\}_{n=0}^{10}$;

generating an early main correlation function $R_{proposed}(\tau+\Delta/2)$ by summing the early BOC(1,1) sub-correlation function $S_0^\alpha(\tau+\Delta/2)$ and the early BOC(6,1) sub-correlation function $S_0^\beta(\tau+\Delta/2)$, and generating a late main correlation function $R_{proposed}(\tau-\Delta/2)$ by summing the late BOC(1,1) sub-correlation function $S_0^\alpha(\tau-\Delta/2)$ and the late BOC(6,1) sub-correlation function $S_0^\beta(\tau-\Delta/2)$; and determining a phase delay $\tau$ for the TMBOC(6,1,4/33)-modulated received signal m(t) based on a discrimination output of a discrimination function based on values of the early and late main correlation functions, and to output the determined phase delay $\tau$ to the local signal generation unit;

wherein the elimination operation is an operation satisfying an algebraic relation in which $|A|+|B|-|A-B|=0$ when real numbers A and B are AB≤0.

7. A method of generating a correlation function of a time-multiplexed binary offset carrier (TMBOC)(6,1,4/33) signal, comprising:

generating a delayed signal m(t+τ) delayed based on a phase delay τ, wherein τ is a real number, with respect to a signal pulse train of a TMBOC(6,1,4/33)-modulated received signal m(t) with respect to a total time 0<t<T, T being a real number;

generating binary offset carrier (BOC)(1,1) partial correlation functions $P_x^\alpha(\tau)$ and BOC(6,1) partial correlation functions $P_y^\beta(\tau)$ by performing an auto-correlation operation on the received signal m(t) and the delayed signal m(t+τ) with respect to a total time T(0≤t≤T) wherein x, y, α, β are integers;

generating a BOC(1,1) sub-correlation function $S_0^\alpha(\tau)$ by performing an elimination operation on the BOC(1,1) partial correlation functions $P_0^\alpha(\tau)$ and $P_1^\alpha(\tau)$;

obtaining a first intermediate correlation function $Q_0^\beta(\tau)$ by performing an elimination operation on a first through and including a twelfth BOC(6,1) partial correlation functions $P_0^\beta(\tau)$ and $P_{11}^\beta(\tau)$ of 12 BOC(6,1) partial correlation functions $\{P_y^\beta(\tau)\}_{y=0}^{11}$, obtaining second through and including, eleventh intermediate correlation functions $\{Q_n^\beta(\tau)\}_{n=1}^{10}$ by performing an elimination operation on a second through and including an eleventh BOC(6,1) partial correlation functions $\{P_y^\beta(\tau)\}_{y=1}^{10}$ and the first intermediate correlation function $Q_0^\beta(\tau)$, and generating the BOC(6,1) sub-correlation function $S_0^\beta(\tau)$ by summing all the first through and including eleventh intermediate correlation functions $\{Q_n^\beta(\tau)\}_{n=0}^{10}$; and generating a main correlation function $R_{proposed}(\tau)$ by summing the BOC(1,1) sub-correlation function $S_0^\alpha(\tau)$ and the BOC(6,1) sub-correlation function $S_0^\beta(\tau)$;

wherein the elimination operation is an operation satisfying algebraic relations in which $|A|+|B|-|A-B|=0$ when real numbers A and B are AB≤0 and $|A|+|B|-|A-B|>0$ when the real numbers A and B are AB>0.

8. An apparatus for tracking a time-multiplexed binary offset carrier (TMBOC)(6,1,4/33)-modulated received signal, comprising:

a frequency offset compensation unit configured to output a compensated received signal compensated for frequency offset of a carrier frequency based on a carrier frequency compensation value with respect to the TMBOC(6,1,4/33)-modulated received signal;

a local code generation unit configured to generate a delay-compensated local code based on a code delay value;

a mixer configured to mix the delay-compensated local code with the frequency offset-compensated received signal;

a DLL configured to repeatedly track and calculate a code delay value that allows a correlation value obtained by correlating the delay-compensated local signal and the frequency offset-compensated received signal with each other is located at an apex of a main peak of a correlation function, and to provide the calculated code delay value to the local code generation unit;

a phase lock loop (PLL) configured to repeatedly calculate a carrier frequency compensation value based on an auto-correlation value of a local code, based on the tracked code delay value, so that a phase error of a carrier signal can be minimized, and to provide the carrier frequency compensation value to the frequency offset compensation unit; and a data extraction unit configured to extract spreading data from a mixture of the delay-compensated local code and the compensated received signal;

wherein the DLL operates to:

generate a binary offset carrier (BOC)(1,1) sub-correlation function by performing an elimination operation on a partial correlation function pair of BOC(1,1) components among partial correlation functions constituting an auto-correlation function of the TMBOC(6,1,4/33)-modulated received signal, generate a BOC(6,1) sub-correlation function by summing a first intermediate correlation function generated by performing an elimination operation on a first and twelfth partial correlation function pair of the BOC(6,1) components and second to eleventh intermediate correlation functions generated by performing an elimination operation on second to eleventh partial correlation functions of the BOC(6,1) components and the first intermediate correlation function, and generate a main correlation function by combining the BOC(1,1) sub-correlation function and the BOC(6,1) sub-correlation function; and wherein the elimination operation is an operation satisfying algebraic relations in which $|A|+|B|-|A-B|=0$ when real numbers A and B are AB≤0 and $|A|+|B|-|A-B|>0$ when the real numbers A and B are AB>0.

9. The apparatus of claim 8, wherein the data extraction unit operates to extract satellite navigation data and estimate a pseudorange based on the extracted satellite navigation data.

10. A satellite navigation signal receiver system, comprising:

a front end unit configured to output a received signal obtained by time-multiplexed binary offset carrier (TMBOC)(6,1,4/33)-modulating a signal in space (SIS) received from an antenna;

a baseband processing unit configured to acquire and track a code delay value with respect to the output received signal using a DLL, to compensate for carrier frequency offset using a PLL, and to extract the contained data from a code delay-compensated local code and a frequency offset-compensated compensated received signal; and an application function processing unit configured to perform a predetermined application function based on the extracted contained data;

wherein the baseband processing unit operates to:

generate a delayed signal m(t+τ) delayed based on a phase delay τ with respect to a signal with respect to a total time 0≤t≤T, T being a real number, wherein τ is a real number, pulse train of the TMBOC(6,1,4/33)-modulated received signal m(t);

generate binary offset carrier (BOC)(1,1) partial correlation functions $P_x^\alpha(\tau)$ and BOC(6,1) partial correlation functions $P_y^\beta(\tau)$ by performing an auto-correlation operation on the received signal m(t) and the delayed signal m(t+τ) with respect to a total time T(0≤t≤T) wherein x, α, β are integers;

generate a BOC(1,1) sub-correlation function $S_0^\alpha(\tau)$ by performing an elimination operation on the BOC(1,1) partial correlation functions $P_0^\alpha(\tau)$ and $P_1^\alpha(\tau)$;

obtain a first intermediate correlation function $Q_0^\beta(\tau)$ by performing an elimination operation on a first and a twelfth BOC(6,1) partial correlation functions $P_0^\beta(\tau)$ and $P_{11}^\beta(\tau)$ of 12 BOC(6,1) partial correlation functions $\{P_y^\beta(\tau)\}_{y=0}^{11}$, obtain a second through and including an eleventh intermediate correlation functions $\{Q_n^\beta(\tau)\}_{n=1}^{10}$ by performing an elimination operation on a second through and including an eleventh BOC(6,1) partial correlation functions $\{P_y^\beta(\tau)\}_{y=1}^{10}$ and the first intermediate correlation function $Q_0^\beta(\tau)$, and generate the BOC(6,1) sub-correlation function $S_0^\beta(\tau)$ by summing all the first through and including eleventh intermediate correlation functions $\{Q_n^\beta(\tau)\}_{n=0}^{10}$;

generate a main correlation function $R_{proposed}(\tau)$ by summing the BOC(1,1) sub-correlation function $S_0^\alpha(\tau)$ and the BOC(6,1) sub-correlation function $S_0^\beta(\tau)$; and upon determination that a main correlation function value based on the phase delay τ is located at an apex of a main peak based on a filtered discrimination output, output a value of the phase delay τ at the time as a code delay value;

wherein the elimination operation is an operation satisfying algebraic relations in which |A|+|B|−|A−B|=0 when real numbers A and B are AB≤0 and |A|+|B|−|A−B|>0 when the real numbers A and B are AB>0.

* * * * *